US010810920B2

(12) United States Patent
Jang

(10) Patent No.: US 10,810,920 B2
(45) Date of Patent: Oct. 20, 2020

(54) SHIFT REGISTER AND DISPLAY DEVICE USING THE SAME

(71) Applicant: LG Display Co., Ltd., Seoul (KR)

(72) Inventor: Yong-Ho Jang, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 713 days.

(21) Appl. No.: 14/701,097

(22) Filed: Apr. 30, 2015

(65) Prior Publication Data

US 2015/0317954 A1 Nov. 5, 2015

(30) Foreign Application Priority Data

May 2, 2014 (KR) .................. 10-2014-0053522
Apr. 27, 2015 (KR) .................. 10-2015-0058714

(51) Int. Cl.
*G11C 19/00* (2006.01)
*G09G 3/20* (2006.01)
(Continued)

(52) U.S. Cl.
CPC ............. *G09G 3/20* (2013.01); *G09G 3/3677* (2013.01); *G09G 5/18* (2013.01); *G11C 19/28* (2013.01); *G11C 19/287* (2013.01); *G09G 3/3208* (2013.01); *G09G 3/344* (2013.01); *G09G 3/3696* (2013.01); *G09G 2310/0286* (2013.01); *G09G 2330/06* (2013.01)

(58) Field of Classification Search
None
See application file for complete search history.

(56) References Cited

U.S. PATENT DOCUMENTS 8,422,621 B2 * 4/2013 Jang ..................... G09G 3/3677
377/64
9,368,230 B2 * 6/2016 Yao ..................... G11C 19/184
(Continued)

FOREIGN PATENT DOCUMENTS

CN 102654968 9/2012
CN 102750898 10/2012
(Continued)

OTHER PUBLICATIONS

Office Action for Chinese Patent Application No. CN 201510218298.8, dated May 9, 2017, 23 Pages (With English Translation).

*Primary Examiner* — Tuan T Lam
(74) *Attorney, Agent, or Firm* — Fenwick & West LLP

(57) ABSTRACT

A shift register capable of preventing leakage current and a display device using the same are disclosed. The shift register includes a plurality of stages. Each stage includes a set unit setting a Q node in response to a start pulse or previous output, an inverter for controlling a QB node to have a logic state opposite to that of the Q node, an output unit for outputting any one input clock or a gate off voltage in response to the logic states of the Q and QB nodes, a reset unit including a reset switching element, the reset switching element resetting the Q node with a first reset voltage in response to a reset pulse or next output, and a noise cleaner resetting the Q node with a second reset voltage in response to the QB node. When the reset switching element is turned off, the first reset voltage is greater than a voltage of the reset pulse or the next output for the current.

7 Claims, 27 Drawing Sheets

(51) Int. Cl.
*G09G 5/18* (2006.01)
*G11C 19/28* (2006.01)
*G09G 3/36* (2006.01)
G09G 3/3208 (2016.01)
G09G 3/34 (2006.01)

(56) References Cited

U.S. PATENT DOCUMENTS

| | | | | |
|---|---|---|---|---|
| 2006/0187177 A1* | 8/2006 | Kuo | ................... | G09G 3/3677 345/100 |
| 2007/0248204 A1* | 10/2007 | Tobita | ................... | G11C 19/28 377/64 |
| 2008/0002805 A1* | 1/2008 | Tobita | ................... | G11C 19/184 377/64 |
| 2010/0177082 A1* | 7/2010 | Joo | ................... | G09G 3/3677 345/211 |
| 2010/0245300 A1* | 9/2010 | Chan | ................... | G09G 3/3677 345/204 |
| 2013/0249876 A1* | 9/2013 | Huang | ................... | G11C 19/28 345/205 |
| 2014/0093028 A1* | 4/2014 | Wu | ................... | G11C 19/28 377/64 |
| 2014/0354655 A1* | 12/2014 | Kim | ................... | G06T 1/20 345/501 |
| 2015/0043703 A1* | 2/2015 | Tan | ................... | G11C 19/28 377/68 |
| 2016/0064098 A1* | 3/2016 | Han | ................... | G11C 19/28 345/211 |
| 2016/0253976 A1* | 9/2016 | Jang | ................... | G09G 3/3677 |
| 2016/0267854 A1* | 9/2016 | Kim | ................... | G09G 3/3466 |

FOREIGN PATENT DOCUMENTS

| | | |
|---|---|---|
| CN | 103198783 | 7/2013 |
| CN | 103366658 | 10/2013 |
| CN | 103489423 | 1/2014 |
| KR | 20110110502 | 10/2011 |
| KR | 20110114836 | 10/2011 |
| KR | 20120011966 | 2/2012 |

* cited by examiner

SHIFT REGISTER AND DISPLAY DEVICE USING THE SAME

This application claims the benefit of Korean Patent Application No. 10-2014-0053522, filed on May 2, 2014, and Korean Patent Application No. 10-2015-0058714, filed on Apr. 27, 2015, which are hereby incorporated by reference as if fully set forth herein.

BACKGROUND OF THE INVENTION

Field of the Invention

The present invention relates to a shift register, and more particularly, to a shift register capable of preventing leakage current so as to output a normal scan pulse and a display device using the same.

Discussion of the Related Art

Examples of a flat panel display device, which is recently attracting considerable attention as a display device, include a liquid crystal display (LCD) device using liquid crystal, an organic light emitting diode (OLED) display device using an OLED, and an electrophoretic display (EPD) device using electrophoretic particles.

A flat panel display device includes a display panel for displaying an image via a pixel array in which each pixel is independently driven by a thin film transistor (TFT), a panel driver for driving the display panel, a timing controller for controlling the panel driver, etc. The panel driver includes a gate driver for driving gate lines of the display panel and a data driver for driving data lines of the display panel.

The gate driver fundamentally includes a shift register for outputting scan pulses for sequentially driving the gate lines of the display panel. The shift register includes a plurality of dependently connected stages and each stage includes a plurality of TFTs. The output of each stage is supplied to each gate line as a scan pulse and is supplied as a control signal for controlling another stage.

In general, each stage includes a node controller including a pull-up transistor for outputting any one clock as a scan pulse according to the voltage of a Q node, a pull-down transistor for outputting a low voltage according to the voltage of a QB node and a plurality of transistors for alternately changing and discharging the Q node and the QB node in response to an input control signal.

As the transistors of each stage, N-type TFTs may be used. In the N-type TFT used in a conventional shift register, the gate voltage is not less than a low voltage applied to the source electrode. Although a low voltage is applied at the gate voltage to logically turn the transistor off, since the gate-source voltage Vgs is greater than 0 V (Vgs>0V), leakage current flows. If a threshold voltage Vth of the transistor is shifted to a negative value, leakage current further increases and thus the circuit does not normally operate. Therefore, the shift register cannot output a normal waveform.

For example, when an oxide transistor sensitive to light is used, if the threshold voltage Vth of the oxide transistor is shifted to a negative value by light, the turned-on state of the pull-up transistor becomes unstable due to leakage current of the node controller. Therefore, the waveform of the scan pulse output via the pull-up transistor may be distorted or the scan pulse may not be output.

SUMMARY OF THE INVENTION

Accordingly, the present disclosure is directed to a shift register and a display device using the same that substantially obviate one or more problems due to limitations and disadvantages of the related art.

An object of the present disclosure is to provide a shift register capable of suppressing leakage current of a turned-off transistor to obtain a stable output and a display device using the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a shift register includes a plurality of stages, wherein each of the plurality of stages includes a set unit configured to set a Q node with a set voltage in response to a start pulse or a previous output for a current stage supplied from any one of previous stages; an inverter configured to control a QB node to have a logic state opposite to a logic state of the Q node; an output unit configured to output any one input clock of a plurality of clocks or a gate off voltage in response to the logic states of the Q node and the QB node; a reset unit including a reset switching element, the reset switching element configured to reset the Q node with a first reset voltage in response to a reset pulse or a next output for the current stage supplied from any of next stages; and a noise cleaner configured to reset the Q node with a second reset voltage in response to the QB node. When the reset switching element is turned off, the first reset voltage is greater than a voltage of the reset pulse or the next output for the current stage, supplied to a gate of the reset switching element.

The output unit may include a scan output unit including a pull-up switching element configured to output the input clock as a scan output in response to the Q node and a pull-down switching element configured to output a first gate off voltage as the scan output in response to the QB node. Alternatively, the output unit may include the scan output unit, and a carry output unit including a carry pull-up switching element configured to output the input clock or any one of carry clocks included in the plurality of clocks as a carry output in response to the Q node and a carry pull-down switching element configured to output a second gate off voltage as the carry output in response to the QB node. The output unit supplies at least one of the scan output and the carry output as at least one of a previous output for any one of the next stages and a next output for any one of the previous stages. When the scan output is output as at least one of a previous output for any one of the next stages and a next output for any one of the previous stages, the first gate off voltage is the gate off voltage. When the carry output is output as at least one of a previous output for any one of the next stages and a next output for any one of the previous stages, the second gate off voltage is the gate off voltage.

The reset unit may include the reset switching element. Alternatively, the reset unit may include a first transistor as the reset switching element, a second transistor configured to supply the first reset voltage to the first transistor in response to the reset pulse or the next output for the current stage, and a third transistor configured to supply an offset voltage to a connection node between the first and second transistors in response to a logic state of the Q node. The first reset voltage is any one of a low voltage, the input clock, the carry clock, the scan output, and the carry output.

The noise cleaner may include an additional reset switching element configured to reset the Q node with second reset voltage in response to the logic state of the QB node. Alternatively, the noise cleaner may include first and second transistors connected between the Q node and a supply terminal of the second low voltage in series to connect the Q node and the supply terminal of the second reset voltage in response to the logic state of the QB node, and a third transistor configured to supply the offset voltage to the connection node between the first and second transistors of the noise cleaner in response to the logic state of the Q node. The second reset voltage is any one of another low voltage, the scan output, and the carry output The set unit may include a set transistor configured to connect a supply terminal for the set voltage to the Q node in response to a logic state of a control terminal. Alternatively, the set unit may include first and second transistors connected to the Q node and the supply terminal for the set voltage in series to connect the Q node and the supply terminal for the set voltage in response to the logic state of a control terminal, and a third transistor configured to supply the offset voltage to the connection node between the first and second transistors of the set unit in response to the logic state of the Q node. The control terminal receives any one of the start pulse, a previous carry output for the current stage and a previous scan output for the current stage as the previous output for the current stage. The supply terminal for the set voltage receives any one of a high voltage, the previous carry output for the current stage and the previous scan output for the current stage.

The carry pull-down switching element may include a carry pull-down transistor configured to connect an output terminal of the carry output and a supply terminal of the second gate off voltage in response to the logic state of the QB node. Alternatively, the carry pull-down switching element may include the first and second transistors connected between an output terminal of the carry output and a voltage supply terminal in series to connect the output terminal of the carry output and the voltage supply terminal in response to the logic state of the QB node, and a third transistor configured to supply the offset voltage to the connection node between the first and second transistors belonging to the carry pull-down switching element in response to the logic state of the Q node. The voltage supply terminal receives any one of the second gate off voltage, the input clock and the carry clock.

When the next output has the first low voltage of the scan output, the reset switching element may be turned off by the first low voltage less than the second low voltage and the third low voltage may be less than the second low voltage. When the next output has the third low voltage of the carry output, the reset switching element may be turned off by the third low voltage less than the second low voltage, and the first and second low voltages may be equal to or different from each other. The third low voltage and the fourth low voltage of the inverter may be equal to or different from each other. The offset may be equal to or greater than the high voltage.

The first gate off voltage is a first low voltage. The first reset voltage is a second low voltage. The second gate off voltage and the second reset voltage are a third low voltage. The plurality of clocks may include n-phase clocks (n being a natural number of 2 or more), high pulses of which are sequentially phase-shifted and circulated. Alternatively, the plurality of clocks may include the n-phase clocks and m-phase carry clocks (m being a natural number of 2 or more), and the m-phase is equal to or different from the n-phase. The voltage of a high logic level of the n-phase clock may be equal to or different from the voltage of a high logic level of the m-phase carry clock and the voltage of a low logic level of the n-phase clock may be equal to or different from the voltage of a low logic level of the m-phase carry clock.

The shift register may further include a QB reset transistor configured to reset the QB node with the fourth low voltage of the inverter in response to the start pulse or the previous output for the current stage.

In another aspect of the present disclosure, a shift register includes a plurality of stages, wherein each of the plurality of stages includes an output unit configured to output any one input clock of a plurality of clocks or a gate off voltage in response to logic states of a Q node and a QB node, a noise cleaner configured to connect a previous output for a current stage and the Q node in response to a previous clock used in a previous stage as a previous output for the current stage at any one of previous stages, and a QB controller configured to control the QB node to have a logic state opposite to the logic state of the Q node in some periods, and wherein the noise cleaner includes first and second transistors connected between the Q node and the previous output for the current stage in series to connect the Q node and the previous output for the current stage in response to a logic state of the previous clock for the current stage, and a third transistor configured to supply an offset voltage to a connection node between the first and second transistors in response to the logic state of the Q node.

The output unit may be as the above-described. The previous clock for the current stage receives the previous clock used in the previous stage for the current stage. The set unit and the reset unit are as the above-described.

The QB controller has a clock which does not overlap the input clock of the output unit among the plurality of clocks, or includes a reset transistor configured to reset the QB node to the second low voltage in response to the Q node and a capacitor configured to carry the input clock to the QB node or a set transistor configured to supply the input clock to the QB node in response to the high voltage, or includes an inverter configured to control the QB node to have a logic state opposite to the logic state of the Q node in response to the logic state of the Q node.

The plurality of clocks may include k-phase clocks, high pulses of which are sequentially phase-shifted and circulated, and adjacent clocks may partially overlap.

The inverter may include a first transistor configured to supply the high voltage or the previous clock to the connection node in response to the high voltage or the previous clock, a second transistor configured to connect the connection node and a supply terminal of the second low voltage in response to the logic state of the Q node, a third transistor configured to supply the high voltage or the previous clock to the QB node in response to the logic state of the connection node, and a fourth transistor configured to connect the QB node and a supply terminal of the second low voltage in response to the logic state of the Q node.

In another aspect of the present disclosure, a display device includes the shift register including the plurality of stages respectively connected to a plurality of gate lines of a display panel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Figure 1:
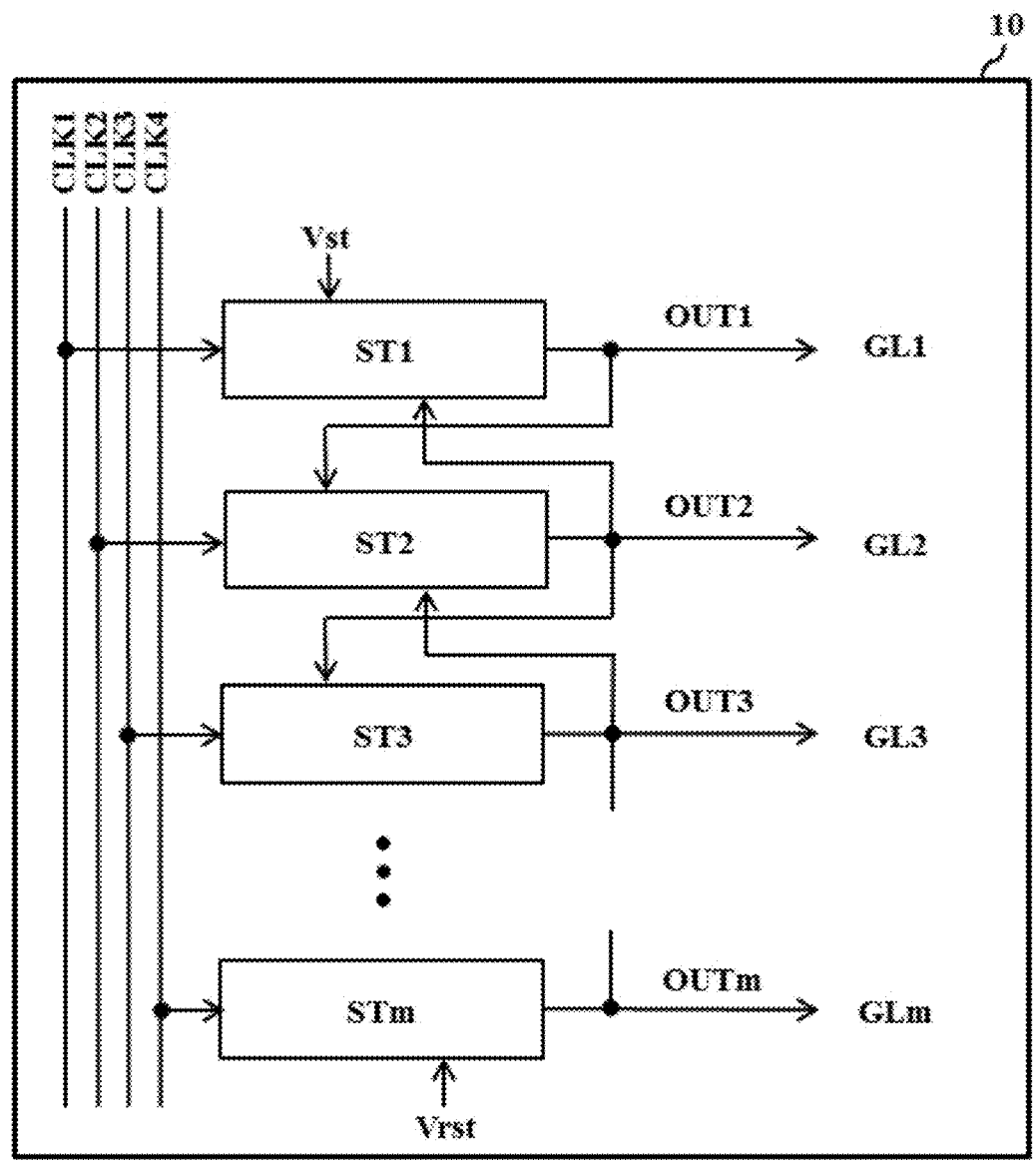
FIG. 1 is a schematic block diagram showing the configuration of a display device including a shift register according to an embodiment of the present invention.

FIG. 1 is a schematic block diagram showing the configuration of a display device including a shift register according to an embodiment of the present invention.

The shift register shown in FIG. 1 includes a plurality of stages ST1 to STm (m being a natural number of 2 or more) respectively connected to a plurality of gate lines GL1 to GLm located at a display panel 10 to sequentially drive the gate lines GL1 to GLm.

Hereinafter, the term "previous stage" indicates any of one or more stages driven before driving of a current stage to output a scan pulse and the term "next stage" indicates any of one or more stages driven after driving of a current stage to output a scan pulse.

The scan outputs OUT1 to OUTm of the stages ST1 to STm are supplied to the respective gate lines and are supplied as carry signals for controlling at least one of the previous stage and the next stage. The first stage ST1 receives a start pulse Vst instead of the carry signal from the previous stage. The last stage STm may receive a reset pulse Vrst instead of the carry signal from the next stage. At least one dummy stage, which is not connected to the gate line to output an output signal to another stage as a carry signal, may be further included next to the last stage.

Each of the stages ST1 to STm receives at least one of k-phase (k being a natural number of 2 or more) clocks CLKs, the phases of the high pulses of which are sequentially delayed, and generates at least one clock supplied to the output unit thereof as the scan output OUT. For example, each of the stages ST1 to STm may sequentially output any one of 4-phase clocks CLK1 to CLK4 (see FIG. 3) as the scan pulse OUT but the present invention is not limited to the 4-phase clock.

Figure 2:
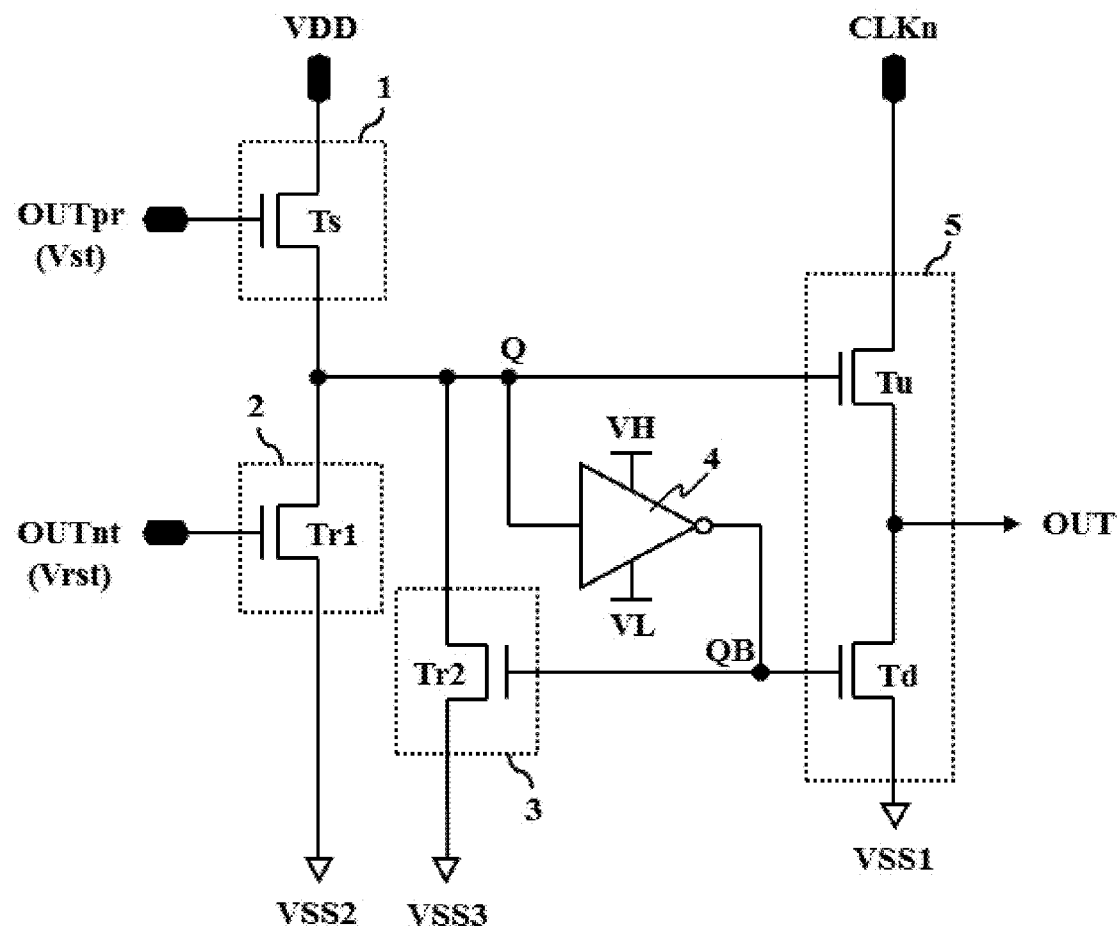
FIG. 2 is a circuit diagram showing the basic configuration of each stage in a shift register according to a first embodiment of the present invention.

FIG. 2 is a circuit diagram showing the basic configuration of each stage in a shift register according to a first embodiment of the present invention.

The stage shown in FIG. 2 includes a set unit 1, a reset unit 2, a noise cleaner 3, an inverter 4 and an output unit 5. The set unit 1, the reset unit 2 and the noise cleaner 3 may be referred to as a Q node controller for controlling a first control node (hereinafter, referred to as a Q node) and the inverter 4 may be referred to as a QB node controller for controlling a second control node (hereinafter, referred to as a QB node) of the output unit 5.

The set unit 1 sets the Q node to a high logic level in response to the scan output OUTpr from the previous stage. The set unit 1 includes a set transistor Ts for setting (charging) the Q node with a high voltage VDD as a set voltage in response to the high logic level of the previous scan output OUTpr. The set unit 1 of the first stage ST1 receives a start pulse Vst instead of the previous scan output OUTpr.

The inverter 4 supplies a voltage having a logic level opposite to that of the Q node to the QB node using a high voltage VH and a low voltage VL.

The output unit 5 outputs any one input clock CLKn among k-phase clocks or a first low voltage VSS1 (a first gate off voltage) as the scan output OUT according to the logic state of the Q node and the QB node. The output unit 5 includes a pull-up transistor Tu for outputting the input clock CLKn as the scan output OUT in response to the high logic level of the Q node and a pull-down transistor Td for outputting the first low voltage VSS1 as the scan output in response to the high logic level of the QB node.

The reset unit 2 resets the Q node to a low logic level in response to the scan output OUTnt from the next stage. The reset unit 2 includes a first reset transistor Tr1 for resetting (discharging) the Q node with a second low voltage VSS2 as a first reset voltage in response to the high logic level of the next scan output OUTnt. The reset unit 2 of the last stage STm may receive a reset pulse Vrst instead of the next scan output OUTnt.

The noise cleaner 3 resets the Q node to a low logic level in response to the voltage of the QB node. The noise cleaner 3 includes a second reset transistor Tr2 for resetting (discharging) the Q node with a third low voltage VSS3 as a second reset voltage in response to the high logic level of the QB node. While the scan output OUT is maintained at the low logic level, whenever the input clock CLKn is at the high logic level, the noise cleaner 3 is discharged to the third low voltage VSS3 to eliminate noise occurring in the Q node due to coupling by a capacitor (not shown) of the pull-up transistor Tu, that is, Q-node noise.

The set transistor Ts of the set unit 1 sets the Q node with the high voltage VDD in response to the start pulse Vst or the previous output OUTpr and thus the pull-up transistor Tu of the output unit 5 outputs the input clock CLKn as the scan output OUT. Next, the first reset transistor Tr1 of the reset unit 2 resets the Q node with the second low voltage VSS2 in response to the next output OUTnt Or the reset pulse Vrst. Thereafter, the pull-down transistor Td of the output unit 5 outputs and maintains the first low voltage VSS1 as the scan output OUT in response to the QB node having the high logic level opposite to that of the Q node by the inverter 4 and the second reset transistor Tr2 resets and maintains the Q node with the third low voltage VSS3. Such operation of each stage is repeated every frame.

The high voltages VDD and VH supplied to the stages may be the same or different and may also be referred to as gate on voltages or charging voltages. The low voltages VSS1, VSS2, VSS3 and VL may also be referred to as gate off voltages or discharging voltages.

In order to prevent leakage current of the Q node via the reset unit 2 and the noise cleaner 3, the low voltages VSS1, VSS2, VSS3 and VL preferably satisfy conditions of VSS2>VSS1 and VSS2>VSS3. In addition, the low voltages preferably satisfy a condition of VSS3≥VL.

More specifically, when the Q node is at a high logic level, the first reset transistor Tr1 of the reset unit 2 is turned off by the first low voltage VSS1 of the next output OUTnt. At this time, if the first low voltage VSS1 of the next output OUTnt applied to the gate of the first reset transistor Tr1 is less than the second low voltage VSS2 applied to the source electrode (VSS2>VSS1), the gate-source voltage Vgs has a negative value less than a threshold voltage and thus the first reset transistor Tr1 is completely turned off. In addition, although the threshold voltage is shifted to a negative value, the first reset transistor Tr1 is completely turned off. For example, the first low voltage VSS1 may be −10V and the second low voltage VSS2 may be −5V. In this case, even when the threshold voltage is shifted to −4V, since the gate-source voltage Vgs is less than the threshold voltage, the first reset transistor Tr1 is completely turned off. As the condition of VSS2>VSS1 is satisfied, it is possible to prevent leakage current of the Q node by the turned-off first reset transistor Tr1.

If the third low voltage VSS3 applied to the Q node by the second reset transistor Tr2 of the noise cleaner 3 in response to the QB node is less than the second low voltage (VSS2>VSS3), the second reset transistor Tr2 may discharge the Q node to a voltage less than that of the first reset transistor Tr1. In other words, the Q node is discharged to the second low voltage VSS2 by the reset unit 2 and then is additionally discharged to the third low voltage VSS3 having a lower level by the noise cleaner 3, thereby more stably maintaining the reset state to eliminate Q node noise by clock coupling.

When the Q node is at a high logic level, the first reset transistor Tr1 is turned off and the second reset transistor Tr2 of the noise cleaner 3 is turned off in response to the QB node having the low logic level opposite to that of the Q node. At this time, if the low voltage VL from the inverter 4 applied to the gate of the second reset transistor Tr2 is less than or equal to the third low voltage VSS3 applied to the source of the second reset transistor Tr2 (VSS3≥VL), the gate-source voltage Vgs has a negative value less than the threshold voltage and thus the second reset transistor Tr2 is completely turned off. In addition, if the low voltage VL from the inverter 4 is less than the third low voltage (VSS3>VL), even when the threshold voltage is shifted to a negative value, the second reset transistor Tr2 is completely turned off. Therefore, as the condition of VSS≥VL is satisfied, it is possible to prevent leakage current of the Q node by the turned-off second reset transistor Tr2.

Figure 3:
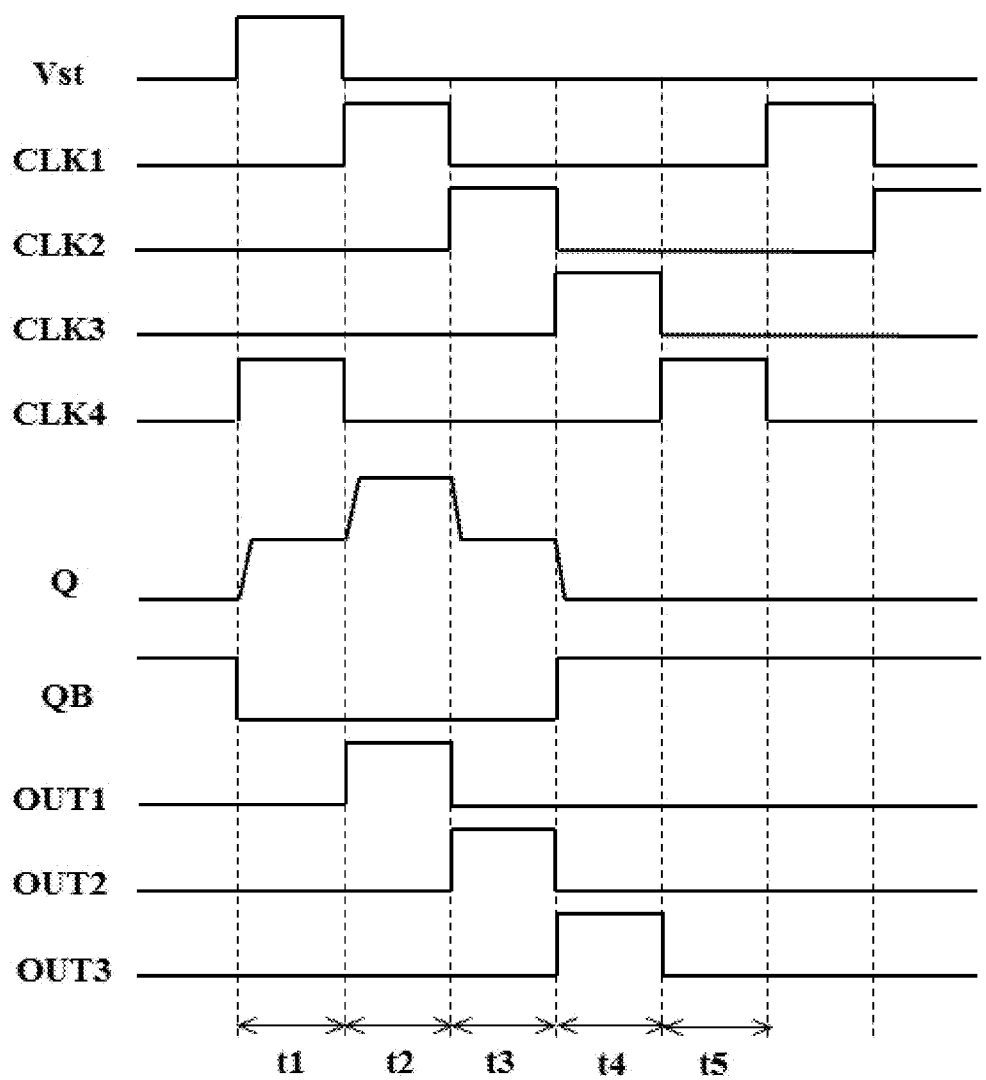
FIG. 3 is a waveform diagram of the stage shown in FIG. 2.

FIG. 3 is a waveform diagram of the stage shown in FIG. 2. Referring to FIGS. 2 and 3, operation of the first stage ST1 in first to fifth periods t1 to t5 will be described.

In the first period t1, the set transistor Ts sets the Q node with the high voltage VDD in response to the high logic level of the start pulse Vst (or the previous scan output OUTpr). Therefore, the pull-up transistor Tu outputs the low logic level of the clock CLK1 as the scan output OUT1 in response to the high logic level of the Q node. The inverter 4 resets the QB node with the low voltage VL in response to the high logic level of the Q node. The pull-down transistor Td and the second reset transistor Tr2 are turned off in response to the low logic level of the QB node. At this time, the first reset transistor Tr1 is also turned off in response to the first low voltage VSS1 having the low logic level of the next scan output OUTnt=OUT3. By the conditions of VSS2>VSS1 and VSS3≥VL, the first and second transistors Tr1 and Tr2 are completely turned off to prevent leakage current of the Q node.

In the second period t2, the set transistor Ts is turned off in response to the low logic level of the start pulse Vst (or the previous scan output OUTpr) and the Q node floats to the high logic state. At this time, the Q node in the floating state is bootstrapped to a higher voltage according to the high logic level of the clock CLK1 applied to the pull-up switching element Tu, such that the pull-up transistor Tu is completely turned on to output the high logic level of the clock CLK1 as the scan output OUT1. At this time, since the QB node and the next scan output OUTnt=OUT3 are maintained at the low logic level equally to the first period t1, the first and second reset transistors Tr1 and Tr2 are completely turned off to prevent leakage current of the Q node.

In the third period t3, as the low logic level of the clock CLK1 is applied to the pull-up transistor Tu, the high voltage of the Q node in the floating state decreases and the pull-up transistor Tu outputs the low logic level of the clock CLK1 as the scan output OUT1. At this time, the first and second reset transistors Tr1 and Tr2 are in the turned-off state equally to the first and second periods t1 and t2.

In the fourth period t4, the first reset transistor Tr1 resets the Q node with the second low voltage VSS2 in response to the high logic level of the next scan output OUTnt=OUT3. In response to the low logic level of the Q node, the pull-up transistor Tu is turned off and the inverter 4 sets the QB node with the high voltage VH. In response to the high logic level of the QB node, the pull-down transistor Td outputs the first low voltage VSS1 as the scan output OUT1 and the second reset transistor Tr2 resets the Q node with the third low voltage VSS3.

In and after the fifth period t5, the first reset transistor Tr1 is turned off in response to the low logic level of the next scan output OUTnt=OUT3, the pull-down transistor Td maintains the scan output OUT of the first low voltage VSS1 in response to the high logic level of the QB node, and the second reset transistor Tr2 maintains the reset state of the Q node at the third low voltage VSS3.

In each stage of the shift register according to the present invention, when the Q node is at a high logic level, that is, when the pull-up transistor Tu outputs the input clock CLKn as the scan output OUT, the first and second reset transistors Tr1 and Tr2 are completely turned off to prevent leakage current of the Q node. The pull-up transistor Tu may stably output the input clock CLKn as the scan output OUT. Further, the shift register according to the present invention can efficiently increase output stability even when the pulse width of the scan signal is greater than one horizontal period (1H) or more.

Figure 4:
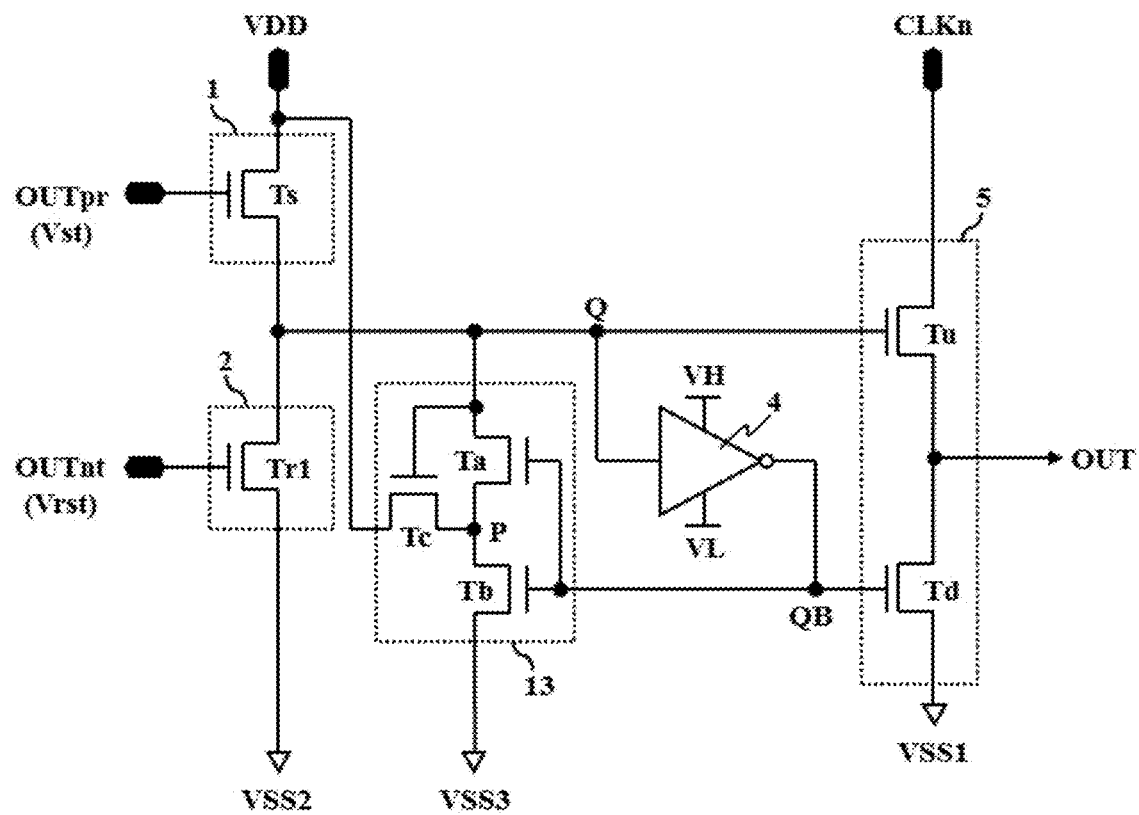
FIG. 4 is a circuit diagram showing the basic configuration of each stage in a shift register according to a second embodiment of the present invention.

FIG. 4 is a circuit diagram showing the basic configuration of each stage in a shift register according to a second embodiment of the present invention.

The stage of the second embodiment shown in FIG. 4 is different from the stage of the first embodiment shown in FIG. 2 in that a noise cleaner 13 is composed of three transistors Ta, Tb and Tc. Thus, a description of the components equal to those of FIG. 2 will be omitted.

The noise cleaner 13 shown in FIG. 4 includes the first and second transistors Ta and Tb which are connected between the Q node and a third low voltage VSS3 terminal in series to reset the Q node with the third low voltage VSS3 in response to the logic state of the QB node and the third transistor Tc for supplying the high voltage VDD, that is, an offset voltage, to a connection node P of the first and second transistors Ta and Tb in response to the logic state of the Q node.

In order to prevent leakage current of the Q node via the reset unit 2 and the noise cleaner 13, the low voltages VSS1, VSS2, VSS3 and VL may satisfy conditions of VSS2>VSS1 and VSS2>VSS3≥VL equally to the first embodiment. Alternatively, VL may be equal to or different from VSS1 or VSS3 or VSS3 may be less than VL.

The first and second transistors Ta and Tb of the noise cleaner 13 is turned off when the QB node is at the low logic level and is turned off when the QB node is at the high logic level, thereby resetting the Q node to the third low voltage VSS3.

When the first and second transistors Ta and Tb are turned off by the low logic level of the QB node, the third transistor Tc is turned on by the high logic level of the Q node. The turned-off third switching element Tc applies the high voltage VDD to the connection node P of the first and second transistors Ta and Tb, that is, it applies the offset voltage to the source of the first transistor Ta connected to the drain of the second transistor Tb. Accordingly, the first transistor Ta is completely turned off by applying the low voltage VL of the QB node to the gate thereof and applying the high voltage VDD to the source thereof such that the gate-source voltage Vgs has a negative value less than the threshold voltage. In addition, even when the threshold voltage of the first transistor Ta is shifted to a negative value, since the gate-source voltage Vgs is less than the threshold voltage by the offset voltage VDD applied to the source, the first transistor Ta is completely turned off. Accordingly, it is possible to prevent leakage current of the Q node via the first and second transistors Ta and Tb.

Since the first transistor Ta is completely maintained in the turned-off state by the offset voltage VDD supplied via the third transistor Tc when the Q node is at a high logic level, in the second embodiment, the third low voltage VSS3 of the noise cleaner 13 may be less than the low voltage VL of the inverter 4. As the offset voltage supplied to the drain of the third transistor Tc, instead of the VDD shown in FIG. 4, another DC voltage (>VL) may be applied.

Figure 5:
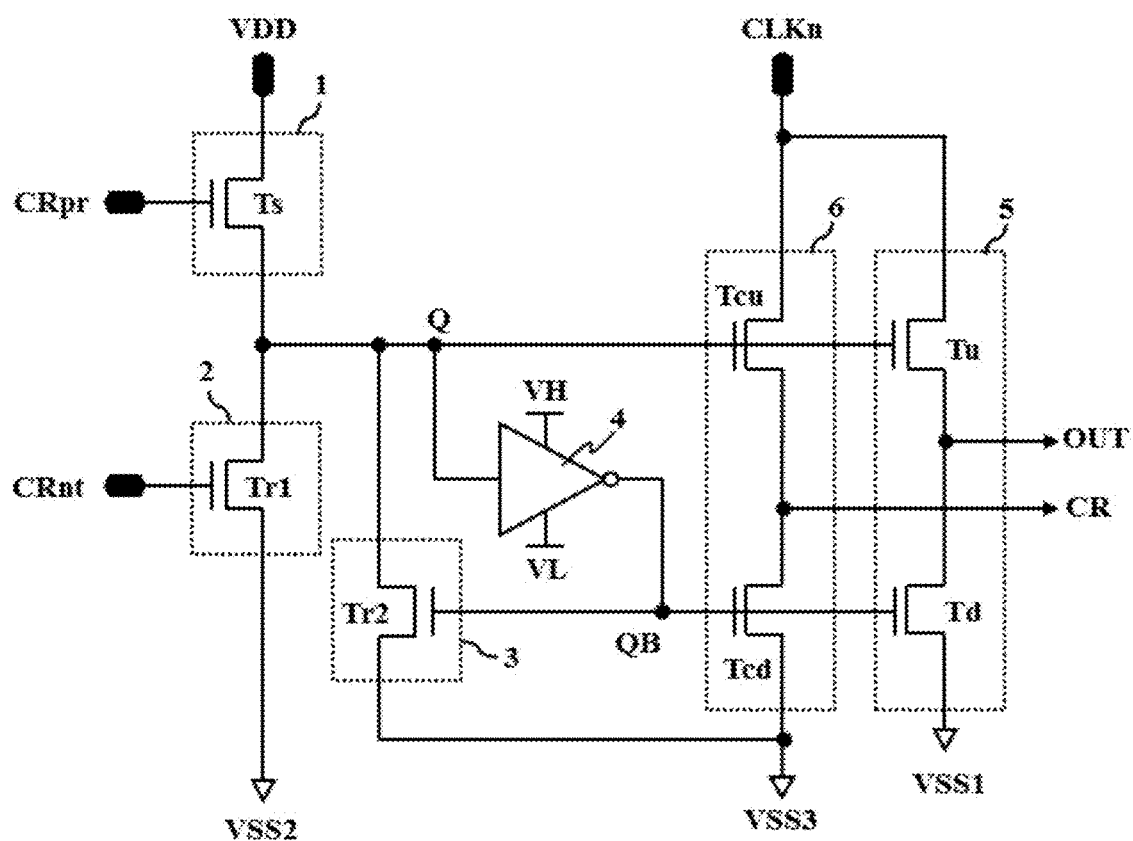
FIG. 5 is a circuit diagram showing the basic configuration of each stage in a shift register according to a third embodiment of the present invention.

FIG. 5 is a circuit diagram showing the basic configuration of each stage in a shift register according to a third embodiment of the present invention.

The stage of the third embodiment shown in FIG. 5 is different from the stage of the first embodiment shown in FIG. 2 in that, as a carry output unit 6 for outputting a carry signal CR is further included, a carry signal CRpr from the previous stage is supplied to the set unit 1 and a carry signal CRnt from the next stage is supplied to the reset unit 2. Accordingly, a description of components equal to those of FIG. 2 will be omitted or given in brief.

A carry pull-up transistor Tcu of the carry output unit 6 outputs the input clock CLKn as the carry signal CR when the Q node is at a high logic level and a carry pull-down transistor Tcd outputs the third low voltage VSS3 (the second reset voltage) as the carry signal CR when the QB node is at a high logic level.

The set transistor Ts of the set unit 1 sets the Q node in response to the previous carry signal CRpr and the first reset transistor Tr1 of the reset unit 2 resets the Q node in response to the next carry signal CRnt.

In the third embodiment shown in FIG. 5, in order to completely turn the first and second reset transistors Tr1 and Tr2 off, the low voltages VSS1, VSS2, VSS3 and VL are preferably greater than VSS3 and VSS3 is preferably equal to or greater than VL. VL may be equal to or different from VSS1 and VSS2 may be equal to or different from VSS1.

When the Q node is at a high logic level, as the third low voltage VSS3 which is the low logic level of the next carry signal CRnt applied to the gate of the first reset transistor Tr1 is less than the second low voltage VSS2 applied to the source (VSS2>VSS3), the first reset transistor Tr1 may be completely turned off to prevent leakage current of the Q node. Since VSS3≥VL, as in the first embodiment, the second reset transistor Tr2 may also be completely turned off to prevent leakage current of the Q node.

Figure 6:
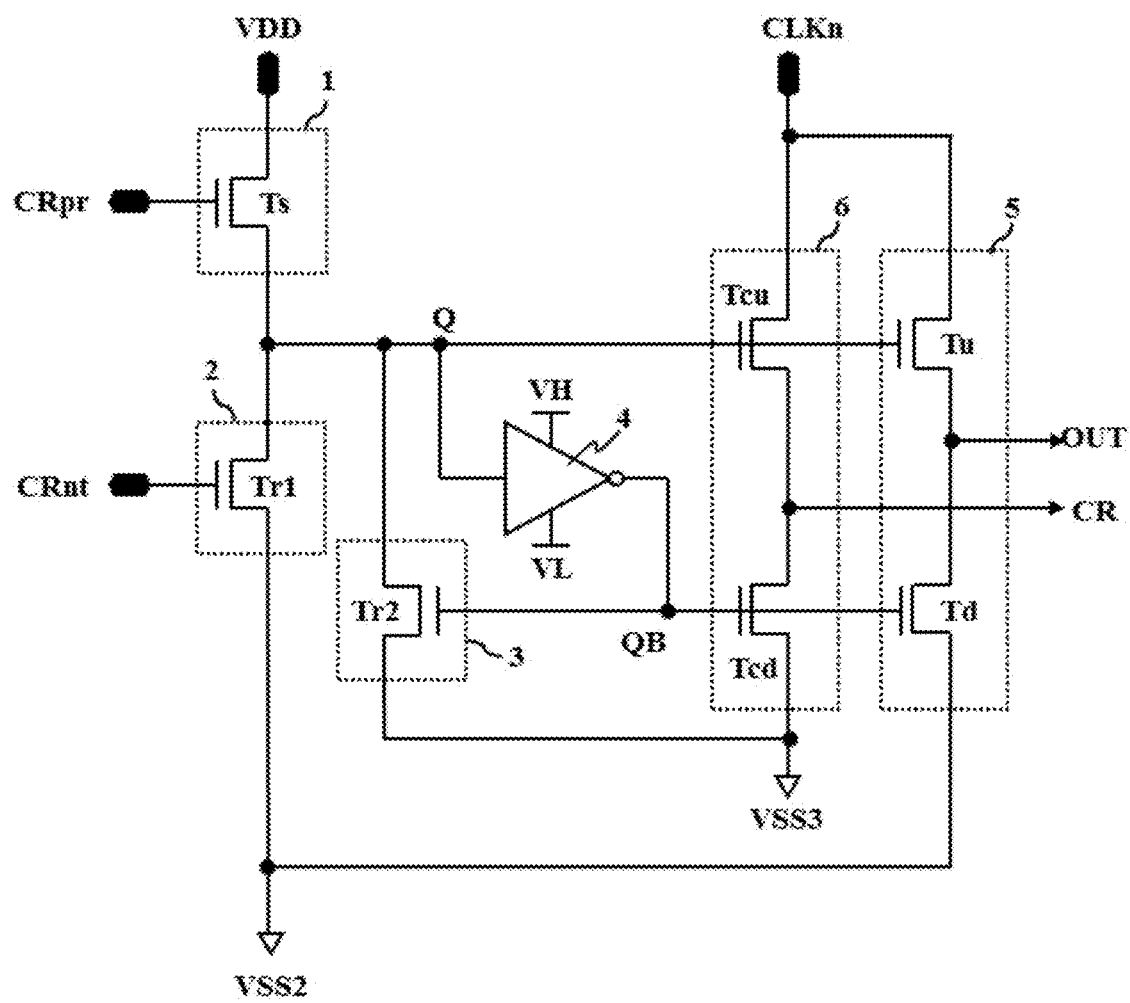
FIG. 6 is a circuit diagram showing the basic configuration of each stage in a shift register according to a fourth embodiment of the present invention.

In the third embodiment of FIG. 5, when VSS2 and VSS1 are the same, as in the fourth embodiment shown in FIG. 6, the source of the pull-down transistor Td and the source of the first reset transistor Tr1 may be commonly connected to the second low voltage VSS2 terminal.

Figure 7:
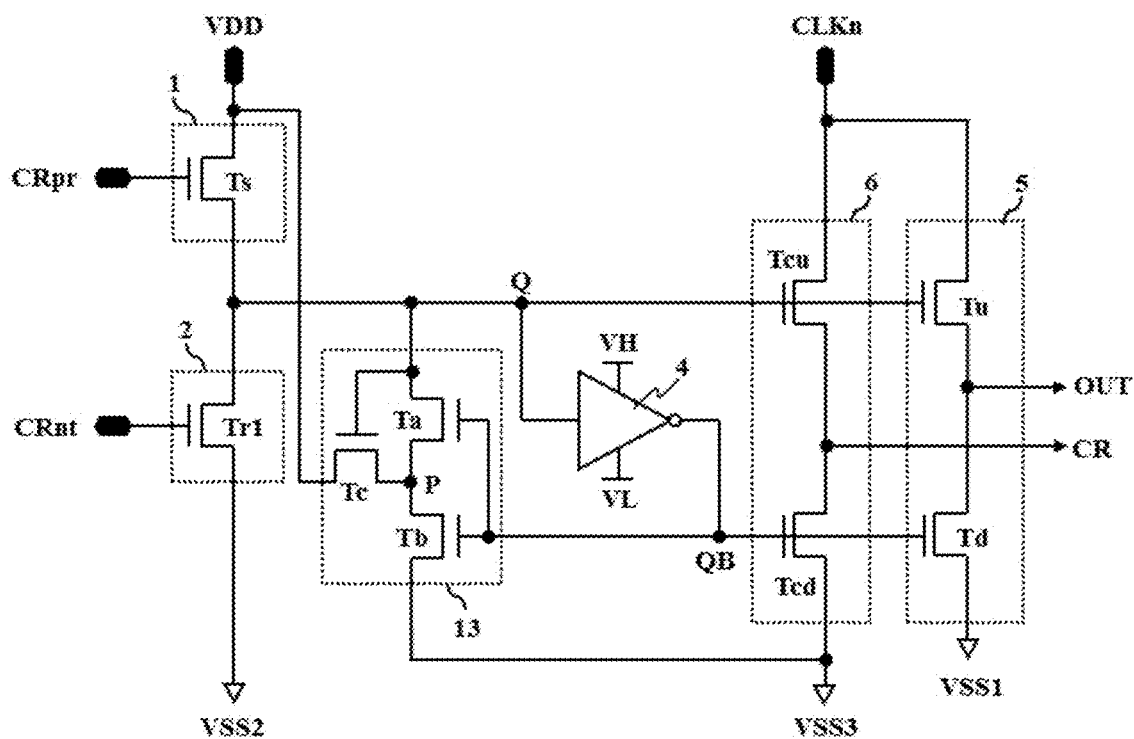
FIG. 7 is a circuit diagram showing the basic configuration of each stage in a shift register according to a fifth embodiment of the present invention.
Figure 8:
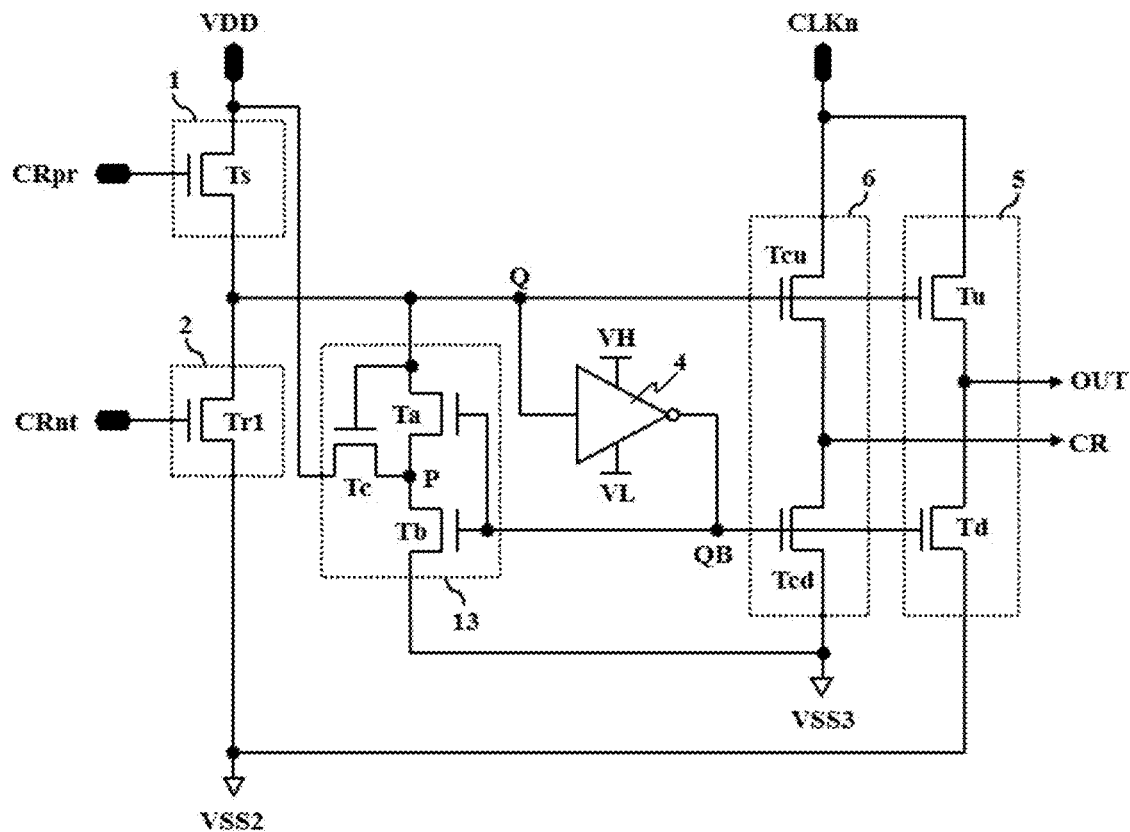
FIG. 8 is a circuit diagram showing the basic configuration of each stage in a shift register according to a sixth embodiment of the present invention.

FIGS. 7 and 8 are circuit diagrams showing the basic configuration of each stage in a shift register according to fifth and sixth embodiments of the present invention.

In the stage of each of the fifth and sixth embodiments respectively shown in FIGS. 7 and 8, instead of the noise cleaner 3 of the third and fourth embodiments shown in FIGS. 5 and 6, the noise cleaner 13 including the first to third transistors Ta, Tb and TC described with reference to the second embodiment of FIG. 4 is included. When the Q node is at a high logic level and the QB node is a low logic level, the third transistor Tc supplies the offset voltage VDD such that the first transistor Ta is completely turned off, thereby preventing leakage current of the Q node.

Figure 9:
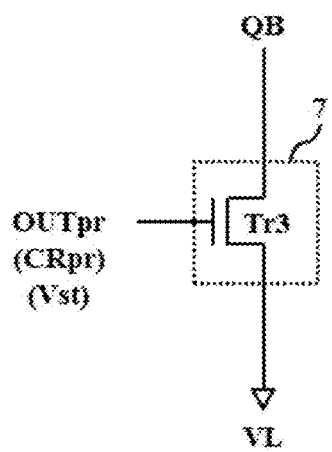
FIG. 9 is a circuit diagram showing a QB reset unit added to each embodiment of the present invention.

FIG. 9 is a circuit diagram showing a QB reset unit added to each stage of the first to sixth embodiments of the present invention.

The QB reset unit 7 shown in FIG. 9 includes a third reset transistor Tr3 for resetting the QB node with the low voltage VL in response to the start pulse Vst, the previous scan output OUTpr or the previous carry signal CRpr. The third reset transistor Tr3 is turned on when the set transistor Ts of the set unit 1 is turned on, such that the third reset transistor Tr3 resets the QB node when the set transistor Ts sets the Q node. The third reset transistor Tr3 of the QB reset unit 7 is applicable to the first to sixth embodiments.

Figure 10:
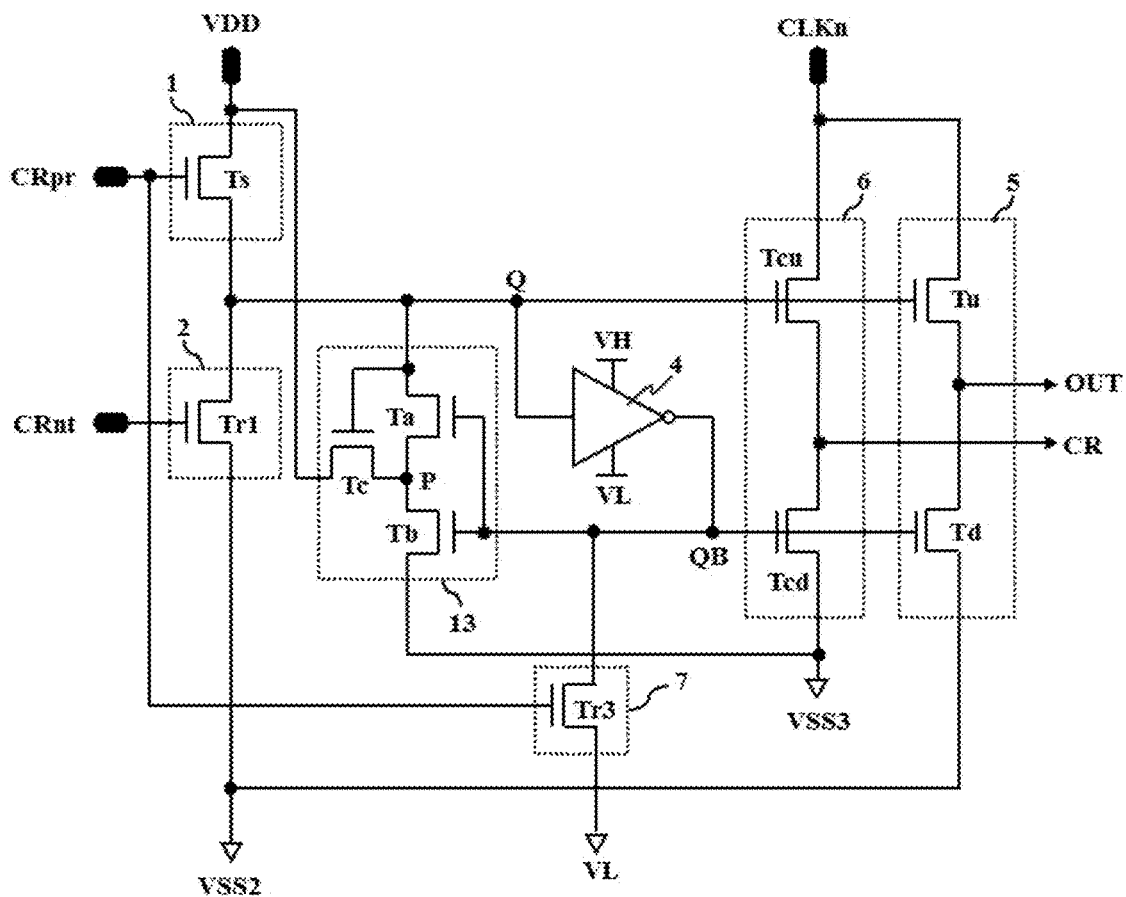
FIG. 10 is a circuit diagram showing the basic configuration of each stage in a shift register according to a seventh embodiment of the present invention.

For example, as in the seventh embodiment shown in FIG. 10, the third reset transistor Tr3 of the QB reset unit shown in FIG. 9 is applied to the stage of the sixth embodiment shown in FIG. 8.

Figure 11A:
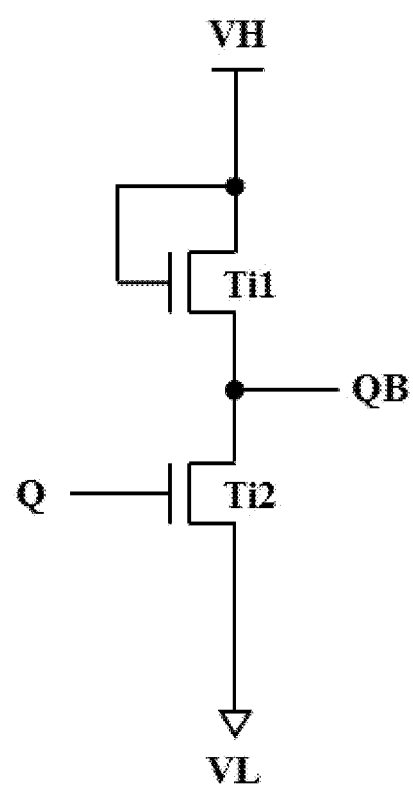
FIGS. 11A and 11B are circuit diagrams showing examples of the internal configuration of an inverter applied to each embodiment of the present invention.
Figure 11B:
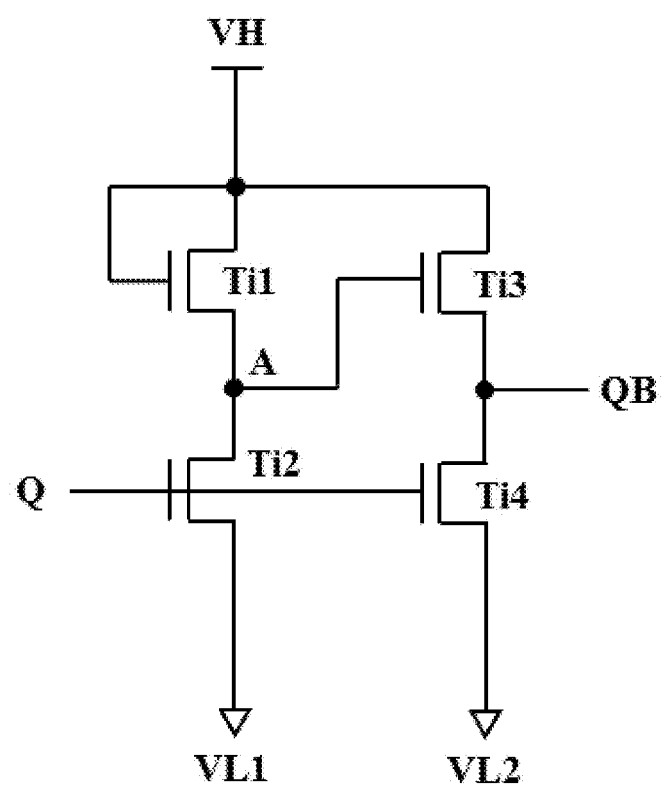

FIGS. 11A and 11B are circuit diagrams showing examples of the internal configuration of the inverter 4 applied to each embodiment of the present invention.

The inverter 4 shown in FIG. 11A includes a first transistor Ti1 connected between a line for supplying the high voltage VH and the QB node in a diode structure and a second transistor Ti2 for resetting the QB node with the low voltage VL in response to control of the Q node.

When the Q node is at a low logic level, the second transistor Ti2 is turned off and the QB node is set with the high voltage VH via the turned-on first transistor Ti1. When the Q node is at a high logic level, the second transistor Ti2 is turned on and, even when the first transistor Ti1 of the diode structure is turned on, the QB node is reset with the low voltage VL via the second transistor ti2. The channel width of the second transistor Ti2 is greater than that of the first transistor Ti1. The low voltage VL of the inverter 4 may be equal to or different from the low voltage VSS3 of the noise cleaner 3 and 13 and the carry output unit 6.

The inverter 4 shown in FIG. 11B includes the first to fourth transistors Ti1 to Ti4.

The first transistor Ti1 of the diode structure supplies the high voltage VH to a node A, the second transistor Ti2 supplies a low voltage VL1 to the node A in response to control of the Q node, the third transistor Ti3 supplies the high voltage VH to the QB node in response to control of the node A, and the fourth transistor Ti4 supplies a low voltage VL2 to the QB node in response to control of the Q node.

When the Q node is at a low logic level, the second and fourth transistors Ti2 and Ti4 are turned off, the node A is set with the high voltage VH via the turned-on first transistor Ti1, the third transistor Ti3 is turned on by the high logic level of the node A, and the QB node is set with the high voltage VH. When the Q node is at a high logic level, the second and fourth transistors Ti2 and Ti4 are turned on, the node A is reset with the low voltage VL1 via the second transistor Ti2 even when the first transistor Ti1 is turned on, and the third transistor Ti3 is turned off. Therefore, the QB node is set with the low voltage VL2 via the turned-on fourth transistor Ti4. VL1 may be equal to or different from VL2 and VL2 may be equal to or different from VSS3.

Figure 12:
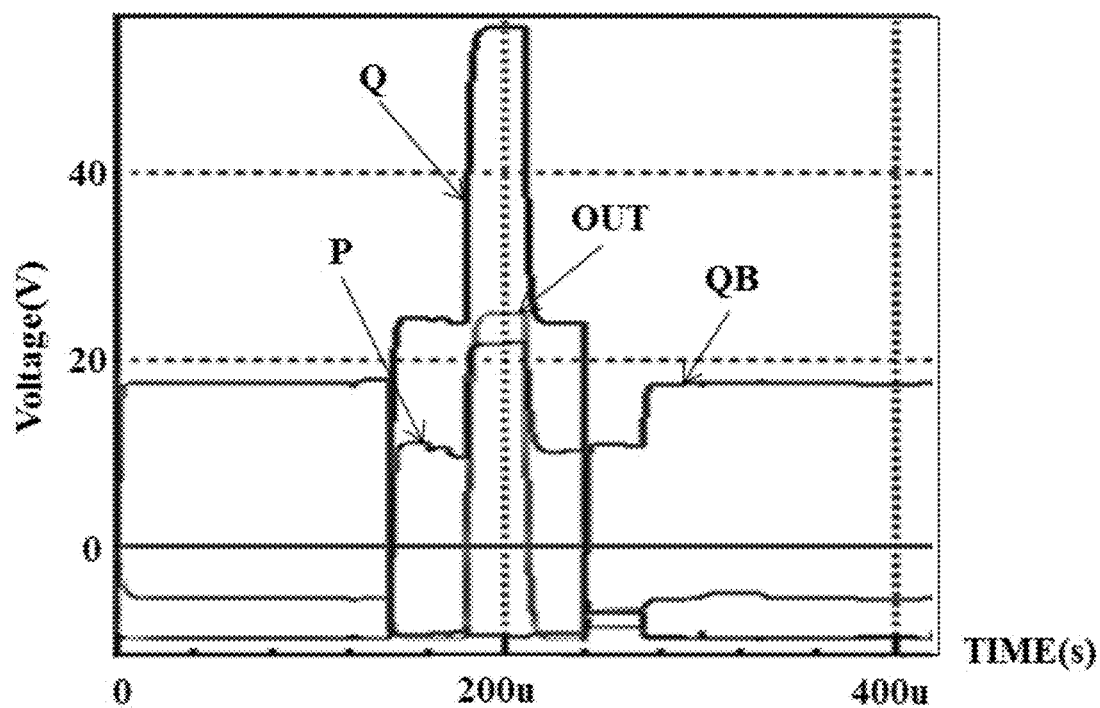
FIG. 12 is a waveform diagram showing simulation of the result of driving the stage shown in FIG. 10.

FIG. 12 is a waveform diagram showing simulation of the result of driving the stage shown in FIG. 10.

FIG. 12 shows the result of driving the stage shown in FIG. 10 by applying −10V as VSS2 (=VSS1) and VL and −5V as the low voltage of the clock CLKn and VSS3 when the threshold voltage of each transistor is −4V.

When the Q node is at a high logic level of 20V or more, a voltage VSS3=−10V is applied to the gate of the first reset transistor Tr1 of the reset unit 2 and a voltage VSS2=−5V is applied to the source of the first reset transistor, such that, even when the threshold voltage is −4V, the first reset transistor Tr1 is completely turned off. In addition, a voltage VL=−10V is applied to the gate of the first transistor Ta of the noise cleaner 13 and an offset voltage of 15V is applied to the connection node P connected to the source of the first transistor Ta via the third transistor Tc, such that, even when the threshold voltage is −4V, the first transistor Ta is completely turned off. Therefore, leakage current of the Q node via the reset unit 2 and the noise cleaner 13 is prevented such that the input clock CLKn is normally output as the scan output OUT via the output unit 5.

Accordingly, the shift register according to the present invention can prevent leakage current of the Q node via the reset unit 2 and the noise cleaner 3 and 13 by adjusting at least one of the low voltages VSS1, VSS2, VSS3 and VL even when the threshold voltage of the transistor is shifted, thereby increasing the range of the threshold voltage, within which the shift register normally operates.

In addition, in the shift register according to the present invention, as in the second, fifth, sixth and seventh embodiments shown in FIGS. 4, 7, 8 and 10, if the noise cleaner 13 is composed of three transistors Ta, Tb and Tc, even when VSS3 is not greater than VL, leakage current of the Q node via the noise cleaner 13 is prevented when the threshold voltage has a negative value, thereby increasing the range of the threshold voltage, within which the shift register normally operates.

Figure 13:
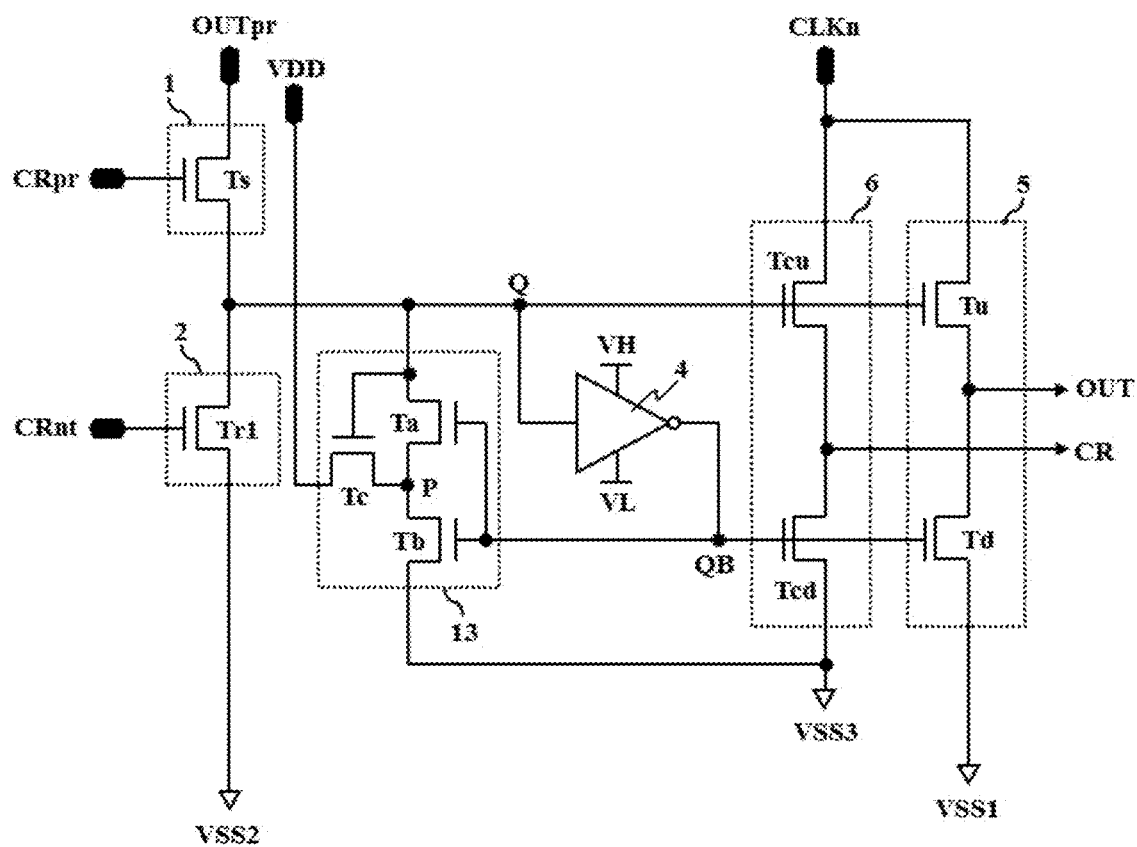
FIG. 13 is a circuit diagram showing the basic configuration of each stage in a shift register according to an eighth embodiment of the present invention.

FIG. 13 is a circuit diagram showing the basic configuration of each stage in a shift register according to an eighth embodiment of the present invention.

The stage of the eighth embodiment shown in FIG. 13 is different from the stage of the fifth embodiment shown in FIG. 7 in that, instead of the high voltage VDD, the previous scan output OUTpr is supplied to the set unit 1. Accordingly, a description of the components equal to those of FIG. 7 will be omitted.

The set transistor Ts of the set unit 1 sets the Q node to the high logic level of the previous scan output OUTpr in response to the high logic level of the previous carry signal CRpr. The previous carry signal CRpr and the previous scan output OUTpr are output from the carry output unit 6 and the output unit 5 of the same previous stage, respectively. Or, the previous carry signal CRpr may be output from the carry output unit 6 of any one previous stage, and the previous scan output OUTpr may be output from the output unit 5 of another previous stage. For example, the previous carry signal CRpr is output from the carry output unit 6 of (n−1)th stage, and the previous scan output OUTpr is output from the output unit 5 of (n−2)th previous stage. At this time, a high level period of the previous carry signal CRpr partially overlaps a high level period of the previous scan output OUTpr.

In the noise cleaner 13, as the offset voltage supplied to the drain of the third transistor Tc, the high voltage VDD or the high voltage VH of the inverter 4 may be applied or another DC voltage may be applied.

In FIG. 13, the low voltages VSS1, VSS2, VSS3 and VL preferably satisfy the condition of VSS1≥VSS2≥VSS3 and VL may be equal to or different from VSS3. VSS3 may be equal to the low voltage of the input clock CLKn.

Figure 14:
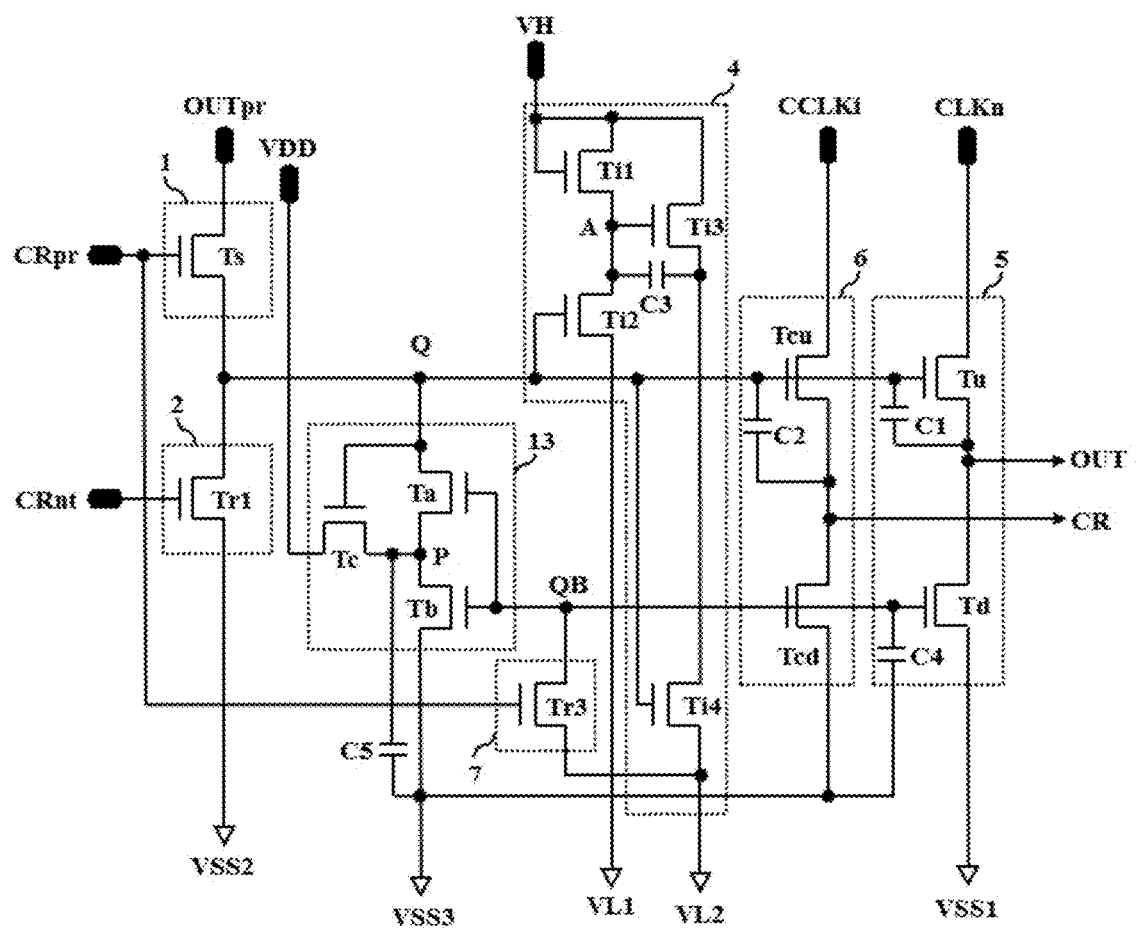
FIG. 14 is a circuit diagram showing the basic configuration of each stage in a shift register according to a ninth embodiment of the present invention.

FIG. 14 is a circuit diagram showing the basic configuration of each stage in a shift register according to a ninth embodiment of the present invention.

The stage of ninth embodiment shown in FIG. 14 is different from the eighth embodiment shown in FIG. 13 in that a carry clock CCLKi supplied to the carry output unit 6 is used differently from the clock CLKn of the output unit 5, the inverter 4 has four transistors Ti1 to Ti4 shown in FIG. 11(b), and a QB reset unit 7 shown in FIG. 9 is further included.

In addition, the stage of the ninth embodiment includes capacitors C1, C2 and C3 respectively connected between the gates and the sources of the pull-up transistor Tu, the carry pull-up transistor Tcu and the third transistor Ti3 of the inverter 4 to bootstrap the respective gates thereof according to the high logic levels applied to the respective drains thereof. Capacitors C4 and C5 may be further included between the QB node and the third low voltage VSS3 terminal and between the connection node P of the noise cleaner 13 and the third low voltage VSS3 to stably maintain the voltage of the QB node and the connection node P. At least one of the capacitors C1 to C5 is applicable to each of the embodiments.

The set unit 1 sets the Q node to a high logic level by the high logic level of the previous carry signal CRpr and the previous scan output OUTpr, the output unit 5 and the carry output unit 6 respectively output the clock CLKn and the carry output CCLKi as the scan output OUT and the carry output CR, and the Q node is reset by the noise cleaner 13 controlled by the QB node and the reset unit 2 controlled by the next carry signal CRnt.

Figure 15:
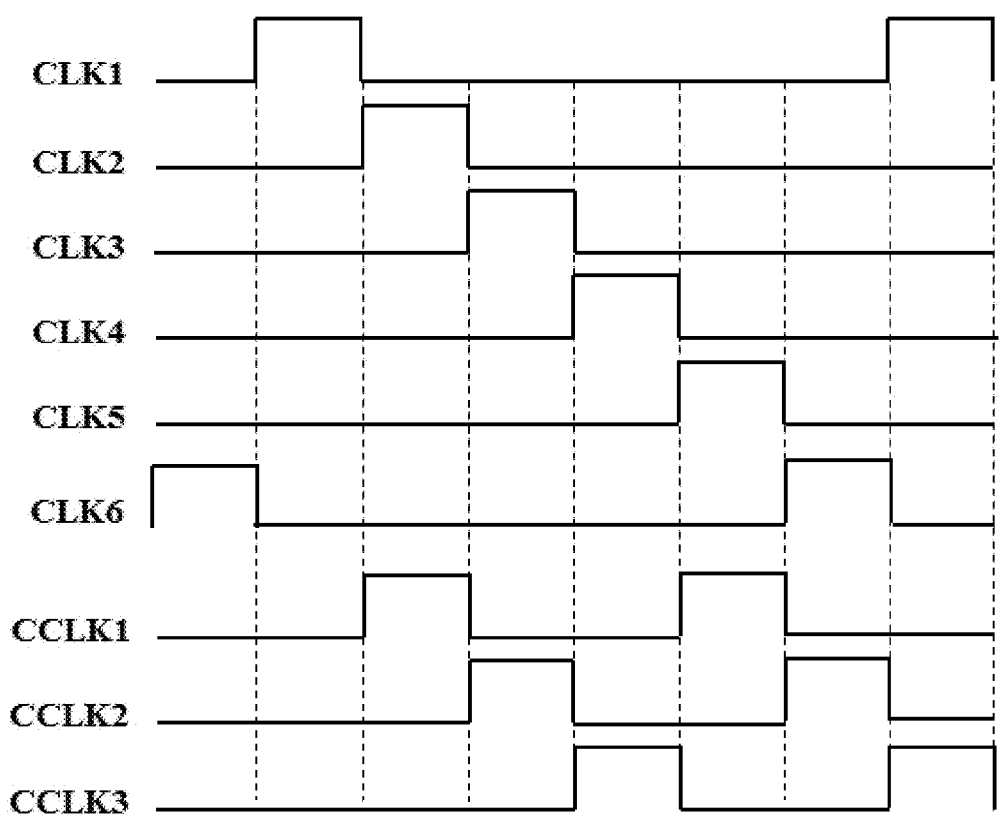
FIG. 15 is a waveform diagram of examples of clocks and carry clocks applied to FIG. 14.

FIG. 15 is a waveform diagram of examples of clocks applied to the ninth embodiment shown in FIG. 14.

Referring to FIG. 15, any one CLKn of 6-phase clocks CLK1 to CLK6 may be supplied to the output unit 5 of each stage and any one CCLKi of 4-phase carry clocks CCLK1 to CCLK3 may be supplied to the carry output unit 6.

The voltages of the clock CLKn and the carry clock CCLKi may be differently set. For example, the low voltage of the clock CLKn used as the scan output OUT may be greater than that of the carry output CCLKi used as the carry output CR and the high voltage of the clock CLKn may be greater than that of the carry clock CCLKi.

Figure 16:
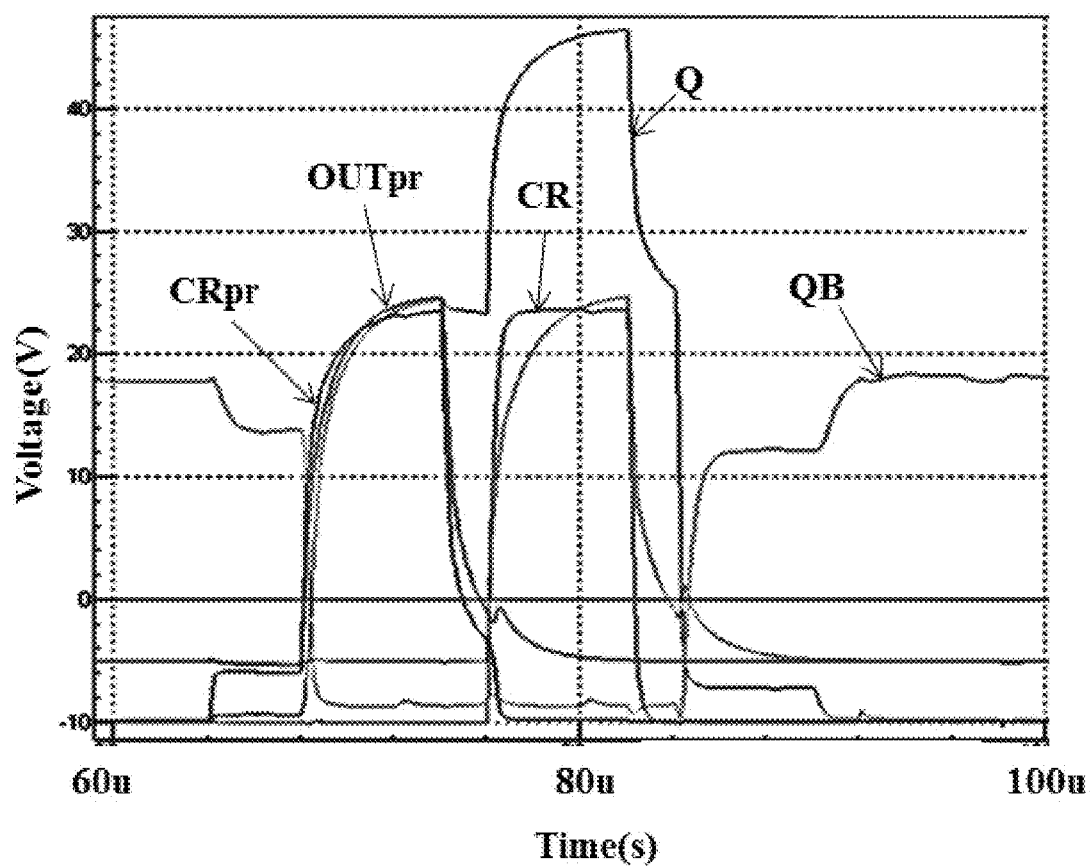
FIG. 16 is a waveform diagram showing simulation of the result of driving the stage shown in FIG. 14.

FIG. 16 is a waveform diagram showing simulation of the result of driving the stage shown in FIG. 14.

FIG. 16 shows the result of driving the stage shown in FIG. 14 by applying −5V as VSS1, VSS2, VL1 and the low voltage of the clock CLKn and applying −10V as VSS3, VL2 and the low voltage of the carry clock CLKn when the threshold voltage of each transistor is −4V.

The set unit 1 sets the Q node to the high logic level by the high logic level of the previous carry signal CRpr and the previous scan output OUTpr, the output unit 5 and the carry output unit 6 respectively output the clock CLKn and the carry output CCLKi as the scan output OUT and the carry output CR, and the reset unit 2 and the noise cleaner 13 reset the Q node.

When the Q node is at a high logic level of 20V or more, a voltage VSS3=−10V is applied to the gate of the first reset transistor Tr1 of the reset unit 2 and a voltage VSS2=−5V is applied to the source of the first reset transistor, such that, even when the threshold voltage is −4V, the first reset transistor Tr1 is completely turned off. In addition, the noise cleaner 13 is also completely turned off as described above. Therefore, leakage current of the Q node via the reset unit 2 and the noise cleaners 3 and 13 is prevented such that the clock CLKn and the carry clock CLKi are normally output as the scan output OUT and the carry signal CR via the output unit 5 and the scan output unit 6, respectively.

The transistor-transistor offset (TTO) structure composed of the first to third transistors Ta, Tb and Tc is applicable to at least one of the set unit 1, the reset unit 2 and the carry pull-down transistor Tcd of each stage of each of the above-described embodiments in order to prevent leakage current in the above-described noise cleaner 13.

Instead of the third voltage VSS3, the scan output OUT of the output unit 5 or the carry output CR of the carry output unit 6 may be applied to the noise cleaner 13.

Figure 17A:
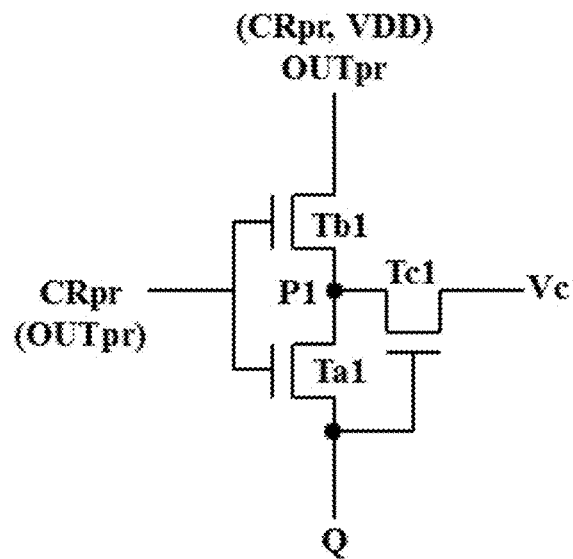
FIG. 17A to 17C are circuit diagrams showing a TTO structure applied to each of a set unit, a reset unit, and a carry pull-down unit of each embodiment of the present invention.
Figure 17B:
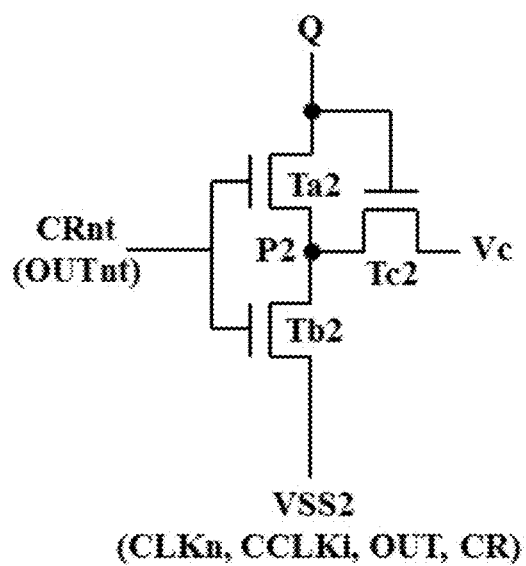
Figure 17C:
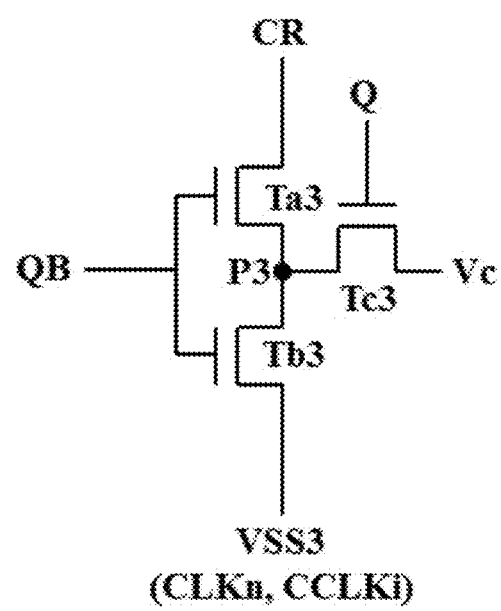

FIG. 17A to 17C are circuit diagrams showing a TTO structure applied to each of the set unit 1, the reset unit 2, and the carry pull-down unit Tcd of each embodiment of the present invention.

FIG. 17A shows the case in which the TTO structure is applied to the above-described set unit 1 instead of the set transistor Ts. The first and second transistors Ta1 and Tb1 are controlled by the previous carry signal CRpr or the previous output OUTpr to connect the Q node and any one of the previous scan output OUTpr, the previous carry CRpr and the high voltage VDD terminal and the third transistor Tc1 is controlled by the Q node to supply the offset voltage Vc to the connection node P1 between the first and second transistors Ta1 and Tb1. When the Q node is at a high logic level and the first and second transistors Ta1 and Tb1 are turned off in response to the previous carry signal CRpr or the previous output OUTpr, the first transistor Ta1 is completely turned off by the offset voltage Vc from the third transistor Tc1 to prevent leakage current of the Q node.

FIG. 17B shows the case in which the TTO structure is applied to the above-described reset unit 2 instead of the first reset transistor Tr1. The first and second transistors Ta2 and Tb2 are controlled by the next carry signal CRnt or the next output OUTnt to connect the Q node and any one of the low voltage VSS2, the clock CLKn, the carry clock CCLKi, the scan output OUT of the current stage, and the carry CR of the current stage. The third transistor Tc2 is controlled by the Q node to supply the offset voltage Vc to the connection node P2 between the first and second transistors Ta2 and Tb2. When the Q node is at a high logic level and the first and second transistors Ta2 and Tb2 are turned off in response to the next carry signal CRpr or the next output OUTnt, the first transistor Ta2 is completely turned off by the offset voltage Vc from the third transistor Tc2 to prevent leakage current of the Q node.

FIG. 17C shows the carry pull-down unit to which the TTO structure is applied instead of the carry pull-down transistor Tcd. The first and second transistors Ta3 and Tb3 are controlled by the QB node to connect the carry output CR and any one of the low voltage VSS3, the clock CLKn, and the carry clock CCLKi terminals. The third transistor Tc3 is controlled by the Q node to supply the offset voltage Vc to the connection node P3 between the first and second transistors Ta3 and Tb3. When the carry output CR is at a high logic level and the first and second transistors Ta3 and Tb3 are turned off in response to QB node, the first transistor Ta3 is completely turned off by the offset voltage Vc from the third transistor Tc3, turned on by the Q node, to prevent leakage current of the carry output CR.

Each stage of the shift register according to the above-described or the after-described embodiments of the present invention uses at least one of the TTO structures of the set unit 1, the reset unit 2 and the carry pull-down unit shown in FIGS. 17A to 17C and the TTO structures of the above-described noise cleaner 13 to efficiently prevent leakage current and increase output stability even when the threshold voltage is shifted to a negative value.

Figure 18:
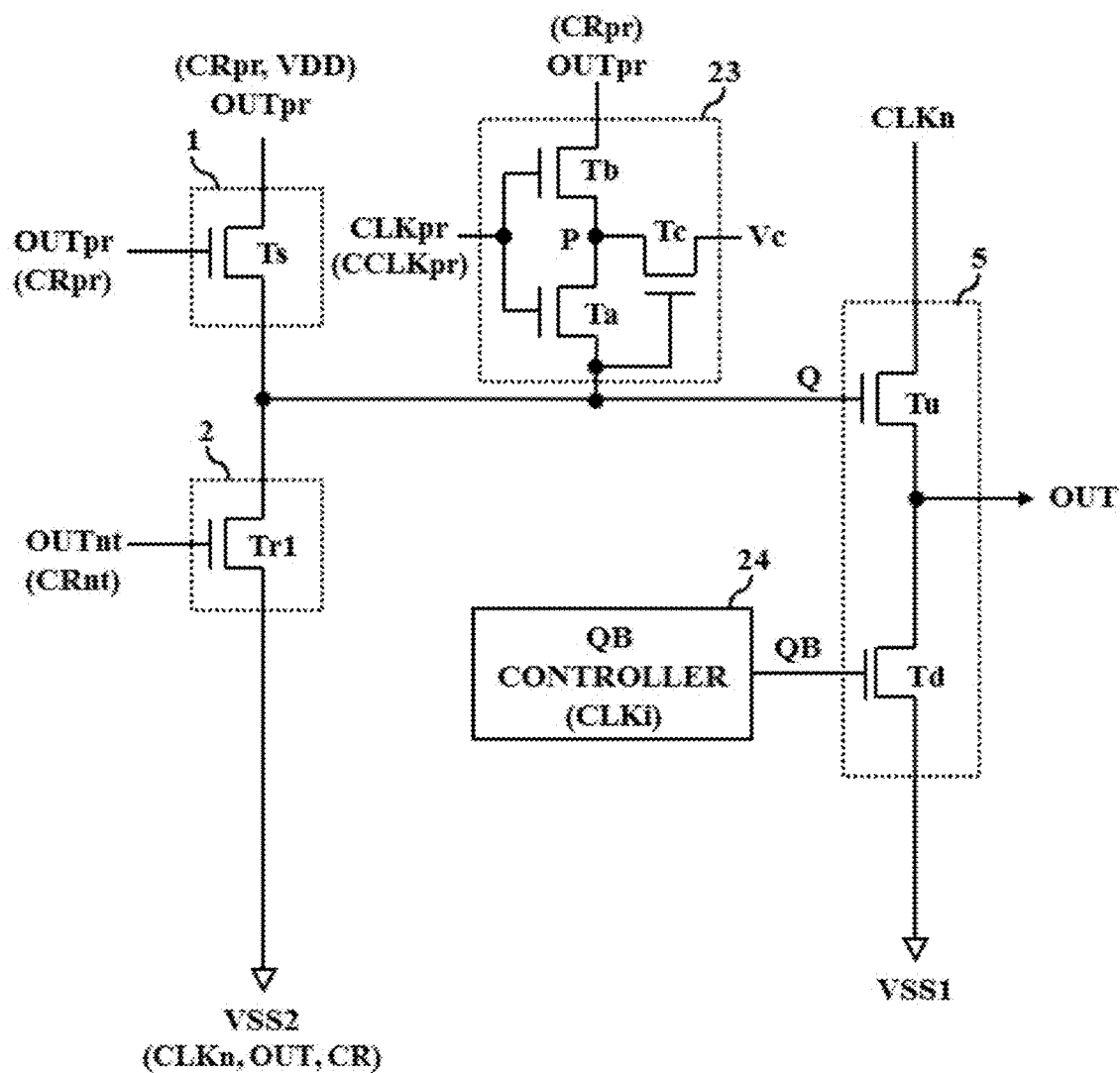
FIG. 18 is a circuit diagram showing the basic configuration of each stage in a shift register according to a tenth embodiment of the present invention.

FIG. 18 is a circuit diagram showing the basic configuration of each stage in a shift register according to a tenth embodiment of the present invention.

The stage of the tenth embodiment shown in FIG. 18 fundamentally includes a set unit 1, a reset unit 2, a noise cleaner 23, an output unit 5 and a QB controller 24.

The set unit 1, the reset unit 2 and the output unit 5 are equal to those of the above-described embodiments and a description thereof will be omitted. Any one of the second low voltage VSS2, the same clock CLKn as the output unit 5, the carry CR of the current stage, and the scan output OUT of the current stage is supplied to the reset unit 2, The TTO structure described with reference to FIG. 17 is applicable to at least one of the set unit 1 and the reset unit 2 or the set unit 1 and the reset unit 2 may be omitted.

The noise cleaner 23 including the first to third transistors Ta, Tb and Tc of the TTO structure eliminates Q node noise occurring by the clock CLKn coupling of the output unit 5 in response to the previous clock CLKpr. The noise cleaner 23 uses the previous clock supplied to the output unit 5 of the previous stage and the output OUTpr of the previous stage. The stage of the tenth embodiment may further include the above-described carry output unit 6. In this case, instead of the previous output OUTpr, the previous carry signal CRpr is supplied to the noise cleaner 23. Or, if the above-described carry output unit 6 uses a separate carry clock CCLKi as shown in FIG. 14, a previous carry clock used as the carry output CRpr in the previous stage is supplied to a gate of the noise cleaner 23.

When the Q node is in a high (set) state, the first and second transistors Ta and Tb are turned off in response to the previous clock CLKpr. At this time, since the third transistor Tc applies the offset voltage Vc to the connection node P between the first and second transistors Ta and Tb in response to the Q node such that the voltage of the source of the first transistor Ta becomes higher than the low voltage of the previous clock CLKpr applied to the gate, the first transistor Ta is completely turned off to prevent leakage current of the Q node. Meanwhile, the previous clock CLKpr and the current clock CLKn partially overlap and thus the previous output OUTpr and the current output OUT may partially overlap. Therefore, when the Q node is in a high (set) state, the first and second transistors Ta and Tb are turned in a period in which the high logic levels of the previous clock CLKpr and the current clock CLKn overlap, such that the high logic level of the previous output OUTpr is further supplied to the Q node.

When the Q node is in a low (reset) state, the first and second transistors Ta and Tb are connected between the Q node and the low voltage of the previous output OUTpr in response to the previous clock CLKpr, such that Q node noise occurring by clock CLKn coupling of the output unit 5 whenever the previous clock CLKpr is in a high state is eliminated.

The QB controller 24 controls the QB node to be at the low logic level when the Q node is at a high logic level. As the simplest example of the QB controller 24, another clock CLKi which does not overlap the input clock CLKn applied to the output unit 5 is applicable.

Furthermore, when the Q node is at a low logic level, the QB controller 24 may control the QB node to be at a high logic level whenever the clock CLKn supplied to the output unit 5 is at a high logic level. Therefore, noise introduced into the output unit OUT via the pull-up transistor Tu is eliminated via the pull-down transistor Td.

FIG. 19A to 19D show components further applicable to the stage of the tenth embodiment shown in FIG. 18.

Figure 19A:
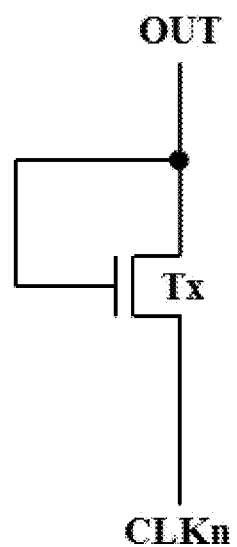
FIG. 19A to 19D are circuit diagrams showing examples of components added to the stage shown in FIG. 18.

Referring to FIG. 19A, a transistor Tx connected between the output unit OUT and the terminal of the clock CLKn supplied to the output unit 5 in a diode structure may be added to the stage shown in FIG. 18.

Figure 19B:
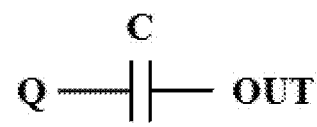

Referring to FIG. 19B, a capacitor C may be added to the stage shown in FIG. 18 between the Q node and the output unit OUT.

Figure 19C:
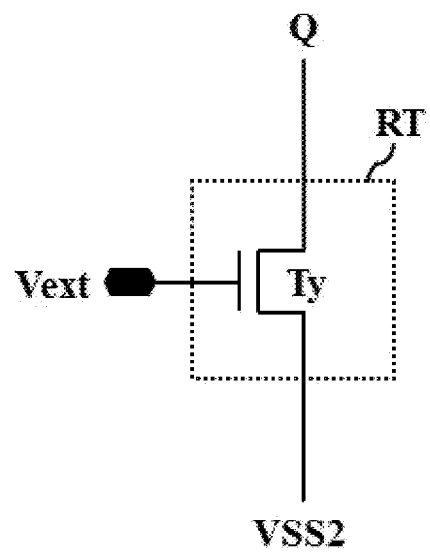
Figure 19D:
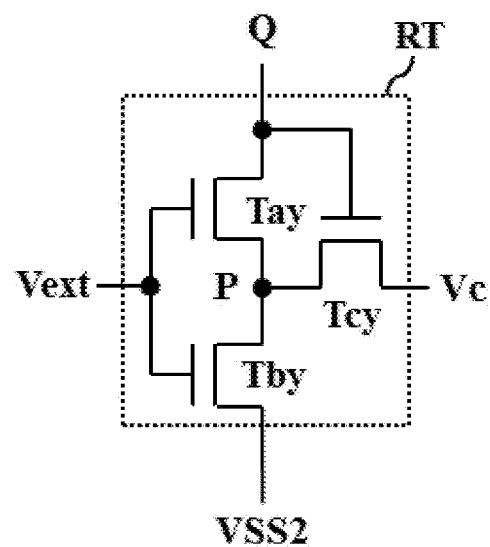

Referring to FIGS. 19C and 19D, an additional reset unit RT for resetting the Q node with the second low voltage VSS2 in response to an external pulse signal Vext applied to one frame once may be added to the stage shown in FIG. 18. The additional reset unit RT may include a reset transistor Ty shown in FIG. 19C or first to third transistors Tay, Tby and Tcy of the TTO structure shown in FIG. 19D. As the external pulse signal Vext, the start pulse Vst may be used.

Figure 20:
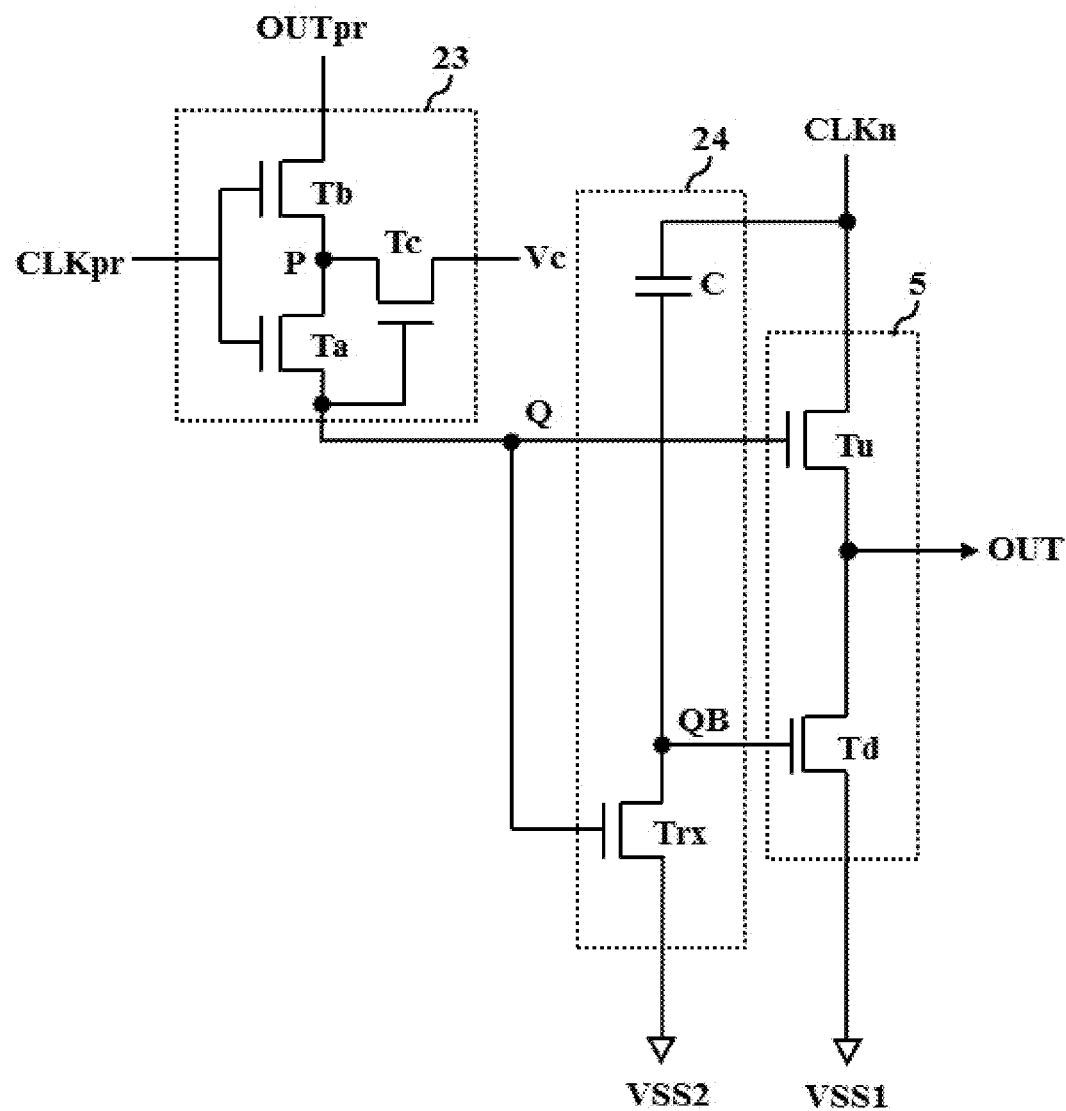
FIG. 20 is a circuit diagram showing the basic configuration of each stage in a shift register according to an eleventh embodiment of the present invention.

FIG. 20 is a circuit diagram showing the basic configuration of each stage in a shift register according to an eleventh embodiment of the present invention.

The stage of the eleventh embodiment shown in FIG. 20 is different from the tenth embodiment shown in FIG. 18 in that the set unit 1 and the reset unit 2 are omitted and the Q node is set and reset via the noise cleaner 23. Thus, a description of the components equal to those of FIG. 18 will be omitted.

The QB controller 24 includes a reset transistor Trx for resetting the QB node in response to the high logic level of the Q node and a capacitor C connected between the clock CLKn terminal and the QB node to set the QB node according to the high logic level of the input clock CLKn when the Q node is at a low logic level.

Figure 21:
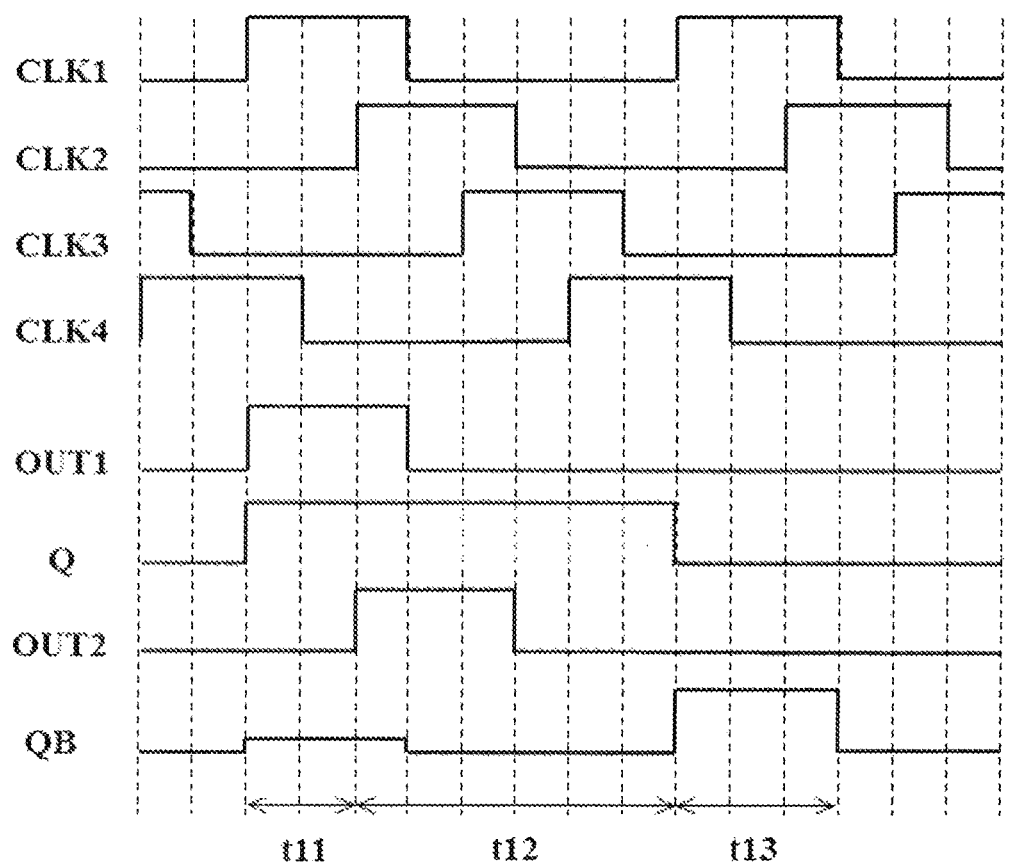
FIG. 21 is a waveform diagram of the stage shown in FIG. 20.

FIG. 21 is a waveform diagram of the stage shown in FIG. 20.

Referring to FIG. 21, the phase of the high pulse is sequentially shifted and circulated, any one CLKn of the 4-phase clocks CLK1 to CLK4 in which at least some high periods (e.g., ⅓) of adjacent clocks overlap is input to the output unit 5 and another previous clock CLKpr=CLKn−1 is input to the noise cleaner 23.

Driving of the second stage will be described with reference to FIGS. 20 and 21.

In a first period t11, when the previous output OUTpr=OUT1 and the previous clock CLKpr=CLK1 are at the high level, the first and second transistors Ta and Tb of the noise cleaner 23 are turned on and the Q node is set to the high logic level of the previous output OUTpr=OUT1.

In a second period t12, the pull-up transistor Tu outputs the input clock CLKn=CLK2 as the scan output OUT=OUT2 in response to the high logic level of the Q node. At this time, in the beginning of the second period t12, the previous output OUTpr=OUT1 and the previous clock CLKpr=CLK are changed to the low level and, when the first and second transistors Ta and Tb are turned off, the first transistor Ta is completely turned off by the offset voltage Vc from the third transistor Tc. As the Q node is maintained at the high level until the previous clock CLKpr=CLK1 is changed to the high level again, the pull-up transistor Tu outputs the input clock CLKn=CLK2 having the high and low levels as the scan output OUT=OUT2.

In a third period t13, since the previous output OUTpr=OUT1 is at the low level when the previous clock CLKpr=CLK1 is changed to the high level again, the Q node is reset to the low level via the noise cleaner 23. At this time, since the QB node of the previous stage ST1 is changed to the high level according to the previous clock CLKpr=CLK1 via the coupling of the capacitor C, the previous output OUTpr=OUT1 is changed to the low level. Thereafter, while the Q node is maintained at the low level, noise occurring in the Q node by coupling of the clock CLKn=CLK2 whenever the input clock CLKn=CLK2 is at the high level is discharged to the low logic level of the previous output OUTpr=OUT1 by the noise cleaner 23 and eliminated whenever the previous clock CLKpr=CLK1 is at the high level. At this time, the pull-down transistor Td is turned on by the QB node which is changed to the high level according to the input clock CLKn=CLK2 by the capacitor C, such that noise introduced into the output unit OUT via the pull-up transistor Tu by the input clock CLKn=CLK2 is discharged to the low voltage VSS1 via the pull-down transistor Td and eliminated.

Figure 22:
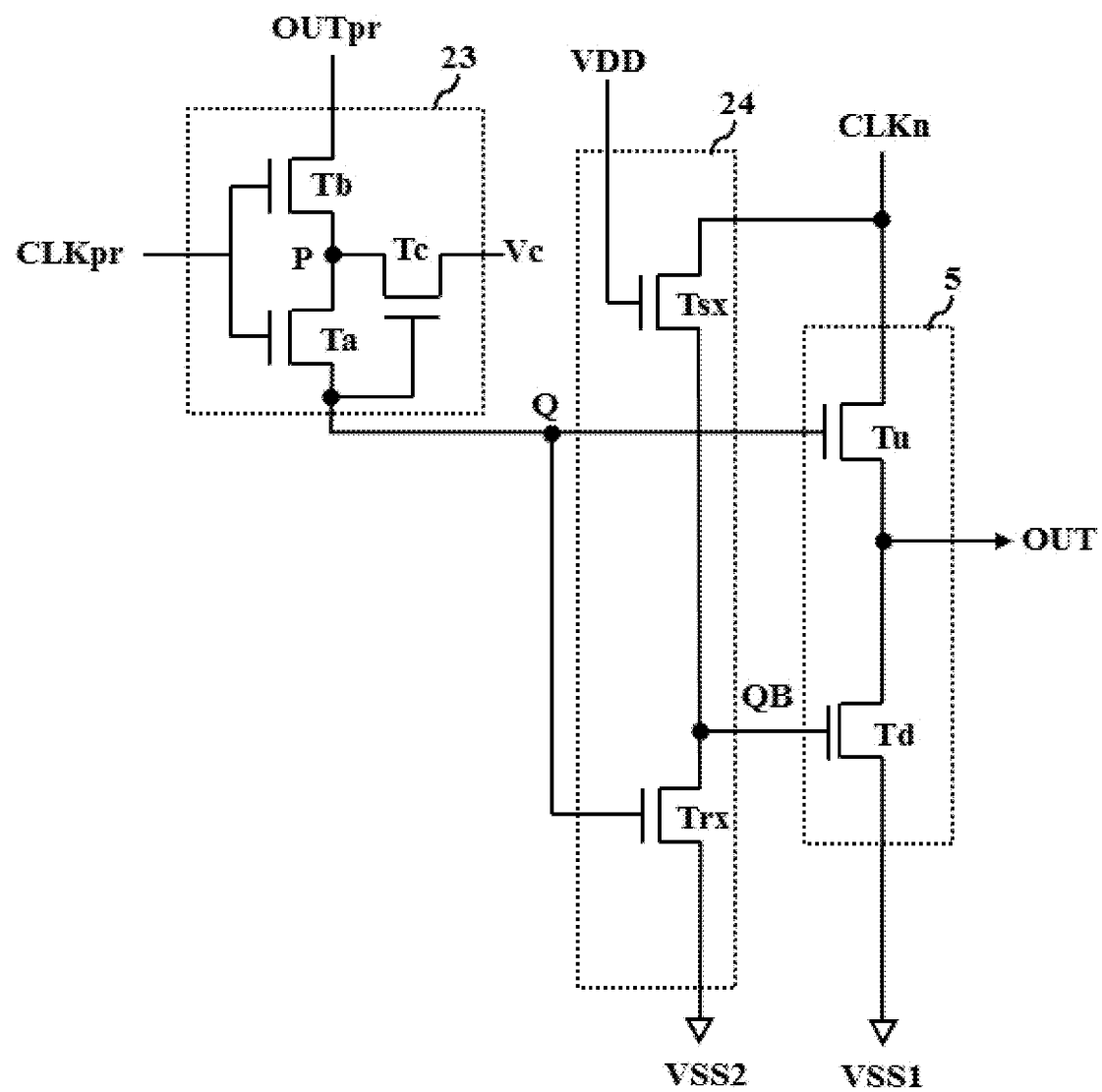
FIG. 22 is a circuit diagram showing the basic configuration of each stage in a shift register according to a twelfth embodiment of the present invention.
Figure 23:
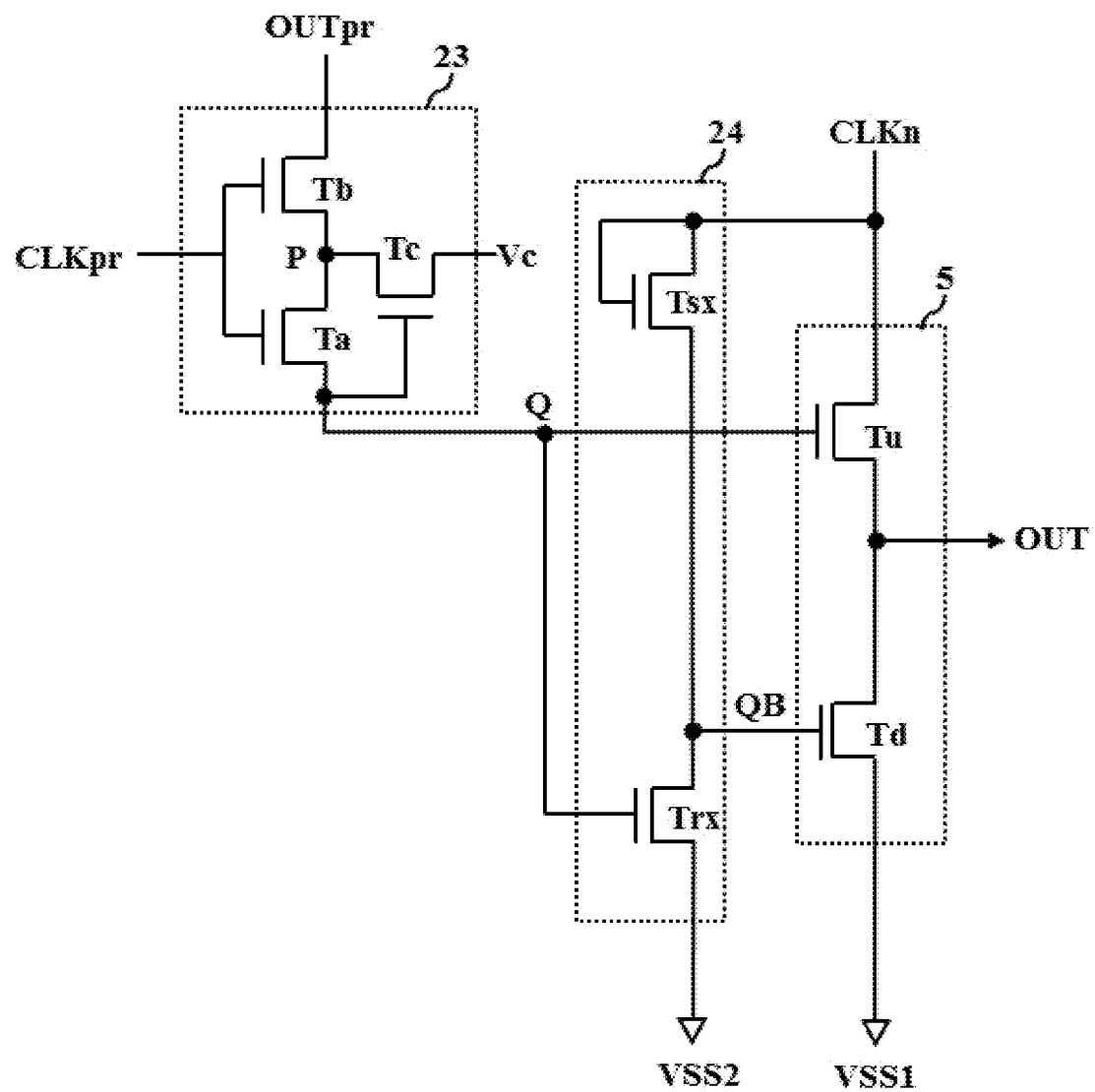
FIG. 23 is a circuit diagram showing the basic configuration of each stage in a shift register according to a thirteenth embodiment of the present invention.

FIGS. 22 to 23 are circuit diagrams showing the basic configuration of each stage in a shift register according to twelfth and thirteenth embodiments of the present invention.

The twelfth and thirteenth embodiments shown in FIGS. 22 and 23 are different from the eleventh embodiment shown in FIG. 20 in that the QB controller 24 includes a set transistor Tsx connected between the clock CLKn terminal and the QB node instead of the capacitor C of FIG. 20. Thus, a description of the components equal to those of FIG. 20 will be omitted.

The set transistor Tsx is maintained in the turned-on state in response to the high voltage VDD to set the QB node to the high level of the input clock CLKn as shown in FIG. 22 or is turned on whenever the clock CLKn is at the high level by commonly connecting the source and drain thereof to the clock CLKn terminal to set the QB node to the clock CLKn as shown in FIG. 23. In the eleventh embodiment of FIG. 22, as the offset voltage Vc applied to the drain of the third transistor Tc of the noise cleaner 23, the high voltage VDD applied to the gate of the set transistor Tsx of the QB controller 24 may be used.

In the QB controller 24, the reset transistor Trx resets the QB node to the second low voltage VSS2 when the Q node is at the high level and the reset transistor Tsx sets the QB node to the high level of the clock CLKn whenever the clock CLKn is at the high level. Therefore, whenever the Q node is at the low level and the clock CLKn is at the high level, the pull-down transistor Td is turned on to eliminate noise of the output unit OUT.

Figure 24:
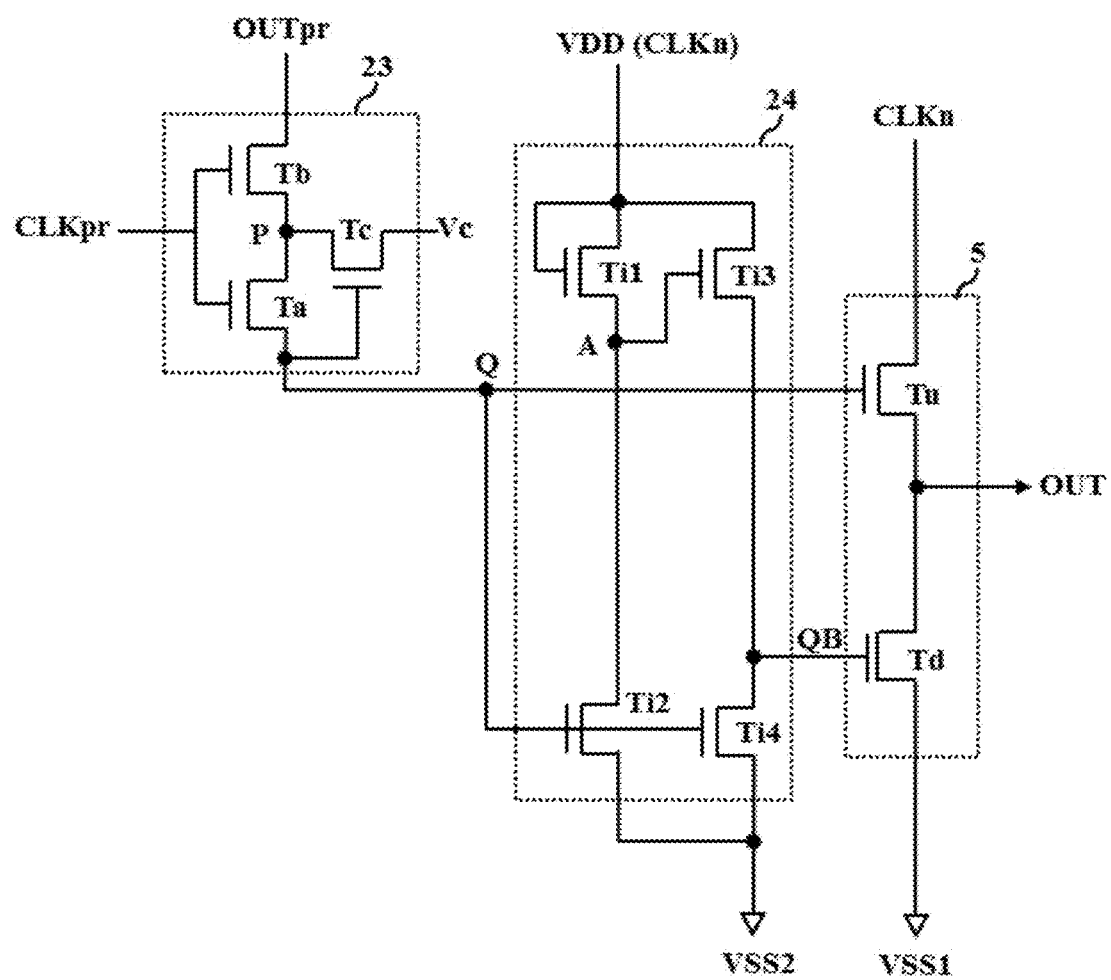
FIG. 24 is a circuit diagram showing the basic configuration of each stage in a shift register according to a fourteenth embodiment of the present invention.

FIG. 24 is a circuit diagram showing the basic configuration of each stage in a shift register according to a fourteenth embodiment of the present invention.

The fourteenth embodiment shown in FIG. 24 is different from the eleventh embodiment shown in FIG. 20 in that the QB controller 24 is composed of an inverter including the first to fourth transistors Ti1 to Ti4 described with reference to FIG. 11B. Thus, a description of the components equal to those of FIG. 20 will be omitted.

In FIG. 24, the QB controller 24 includes a series structure of the first and second transistors Ti1 and Ti2 between the high voltage VDD or the clock CLKn terminal and the second low voltage VSS2 and a series structure of the third and fourth transistors Ti3 and Ti4, both of which are connected in a parallel structure, and sets or resets the QB node in response to the Q node. The first transistor Ti1 has a diode structure and is turned on in response to the high voltage VDD or the clock CLKn, the third transistor Ti3 is turned on in response to the logic state of the connection node A between the first and second transistors Ti1 and Ti2, and the second and fourth transistors Ti2 and Ti4 are turned on in response to the logic state of the Q node.

The QB controller 24 resets the QB node to the second low voltage VSS2 when the Q node is at the high level and sets the QB node to the high voltage VDD when the Q node is at the low level or sets the QB node to the high level of the clock CLKn whenever the clock CLKn is at the high level. Therefore, when the QB node is at the high level, the pull-down transistor Td is turned on to eliminate noise of the output unit OUT.

Figure 25:
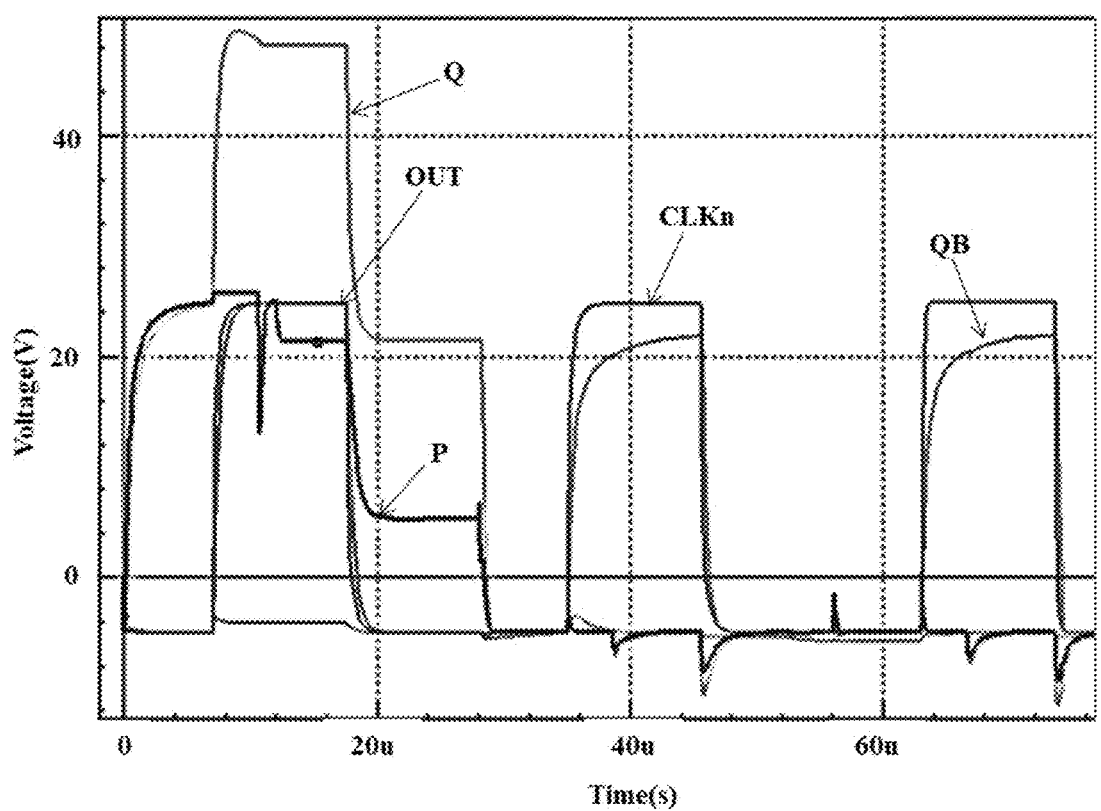
FIG. 25 is a waveform diagram showing simulation of the result of driving the stage shown in FIG. 22.

FIG. 25 is a waveform diagram showing simulation of the result of driving the stage shown in FIG. 22.

Each of the 11th to 14th embodiments further comprises the above-described set unit 1 and the above-described reset unit 2, and further comprises the above-described carry output unit 6.

FIG. 25 shows the result of driving the stage shown in FIG. 22 by supplying the high voltage VDD to the third transistor Tc as the offset voltage Vc, supplying the first clock CLK1 shown in FIG. 21 to the current clock CLKn and supplying the fourth clock CLK4 to the previous clock CLKpr in a state in which the threshold voltages of the first and second transistors Ta and Tb of the noise cleaner 23 are negative values.

When the high logic level of the clock CLKn=CLK1 is supplied to the scan output OUT in a period in which the Q node is at a high logic level of 20V or more, although the previous clock CLKpr=CLK4 and the previous output OUTpr are changed to the low level to turn the first and second transistors Ta and Tb off, the third transistor Tc applies the high voltage VDD to the connection node P to increase the voltage of the source of the first transistor Ta to be higher than the low voltage of the previous clock CLKpr=CLK4 applied to the gate, thereby completely turning the first transistor Ta off. Therefore, leakage current of the Q node via the noise cleaner 23 is prevented such that the clock CLKn=CLK1 is normally output as the scan output OUT via the output unit 5.

In addition, whenever the clock CLKn=CLK1 is changed to the high logic level in the period in which the Q node is at the low logic level, noise introduced into the Q node is eliminated via the noise cleaner 23 and noise introduced into the output unit OUT is eliminated via the pull-down transistor Td by the high logic level of the QB node.

As described above, the shift register according to the present invention can adjust at least one of the low voltages VSS1, VSS2, VSS3 and VL to prevent leakage current of the Q node via the reset unit 2 and the noise cleaners 3 and 13 even when the threshold voltage of the transistor is shifted to a negative value, thereby increasing the range of the threshold voltage, within which the shift register normally operates.

In addition, the shift register according to the present invention can apply the TTO structure, in which at least one of the set unit 1, the reset unit 2, the noise cleaners 3, 13 and 23 and the carry pull-down unit is composed of three transistors Ta, Tb and Tc, to prevent leakage current of the Q node even when the threshold voltage is shifted to a negative value, thereby increasing the range of the threshold voltage, within which the shift register normally operates.

In the shift register and the display device using the same according to the present invention, even when the threshold voltage of the transistor is shifted to a negative value, at least one of a plurality of low voltages is adjusted to completely turn the transistor connected to the Q node off in the reset unit and the noise cleaner to prevent leakage current of the Q node, thereby increasing the range of the threshold voltage, within where the shift register normally operates.

In the shift register and the display device using the same according to the present invention, a TTO structure, in which at least one of the set unit, the reset unit, the noise cleaner and the carry pull-down unit is composed of three transistors, is applied to prevent leakage current of the Q node even when the threshold voltage is shifted to a negative value, thereby increasing the range of the threshold voltage, within which the shift register normally operates.

It will be apparent to those skilled in the art that various modifications and variations can be made in the present disclosure without departing from the spirit or scope of the disclosures. Thus, it is intended that the present disclosure cover the modifications and variations of this disclosure provided they come within the scope of the appended claims and their equivalents.

What is claimed is:

1. A shift register comprising a plurality of stages, the shift register configured to drive gate lines of a display device,
    wherein each of the plurality of stages includes:
    an output unit configured to output any one input clock of a plurality of clocks or a gate off voltage in response to logic states of a first control node and a second control node;
    a noise cleaner configured to connect a previous output for a current stage and the first control node in response to a previous clock used in a previous stage as a previous output for the current stage at any one of previous stages, wherein a pulse of the previous clock partially overlaps a pulse of the any one input clock at a same logic level so that the noise cleaner eliminates noise of the first control node occurred by coupling of the any one input clock; and
    a controller configured to control the second control node to have a logic state opposite to the logic state of the first control node in some periods, and
    wherein the noise cleaner includes:
    first and second transistors connected between the first control node and the previous output for the current stage in series to connect the first control node and the previous output for the current stage in response to a logic state of the previous clock for the current stage, and
    a third transistor configured to supply an offset voltage to a first connection node between the first and second transistors in response to the logic state of the first control node, the offset voltage being a different voltage than a first predetermined voltage and a second predetermined voltage corresponding to logic states of the second control node, wherein the offset voltage is greater than the second predetermined voltage, and
    wherein the controller includes an inverter configured to supply said any one input clock to the second control node in some periods, except an output period which the output unit outputs said any one input clock.

2. The shift register according to claim 1, wherein:
    in a first period, the first control node is set to a first logic level of the previous output through the noise cleaner when the previous clock and the previous output are first logic levels,
    in a second period, the output unit outputs the any one input clock as an output of a corresponding stage while the first control node is maintained at the first logic level
    in a third period, the first control node is reset to a second logic level of the previous output through the noise cleaner when the previous clock is the first logic level and the previous output is the second logic level, and thereafter, while the first control node is maintained at the second logic level, the noise of the first control node by the any one input clock is eliminated through the noise cleaner in the overlap time of the pulses of the previous clock and the any one input clock whenever the any one input clock is the first logic level.

3. The shift register according to claim 1, wherein:
    the inverter includes:
    a first inverter unit transistor configured to supply said any one input clock to a connection node in response to said any one input clock;
    a second inverter unit transistor configured to connect the connection node and a second predetermined voltage in response to the logic state of the first control node;
    a third inverter unit transistor configured to supply said any one input clock to the second control node in response to a logic state of the connection node; and
    a fourth inverter unit transistor configured to connect the second control node and the supply terminal of the second predetermined voltage in response to the logic state of the first control node.

4. A shift register comprising a plurality of stages, the shift register configured to drive gate lines of a display device,
    wherein each of the plurality of stages includes:
    an output unit configured to output any one input clock of a plurality of clocks or a gate off voltage in response to logic states of a first control node and a second control node;
    a noise cleaner configured to connect a previous output for a current stage and the first control node in response to a previous clock used in a previous stage as a previous output for the current stage at any one of previous stages, wherein a pulse of the previous clock partially overlaps a pulse of the any one input clock at a same logic level so that the noise cleaner eliminates noise of the first control node occurred by coupling of the any one input clock, wherein the noise cleaner includes:
    first and second transistors connected in series between the first control node and the previous output for the current stage to connect the first control node and the previous output for the current stage in response to a logic state of the previous clock for the current stage, and
    a third transistor configured to supply an offset voltage to a first connection node between the first and second transistors in response to the logic state of the first control node, the offset voltage being a different voltage than a first predetermined voltage and a second predetermined voltage corresponding to logic states of the second control node, wherein the offset voltage is greater than the second predetermined voltage; and
    a controller configured to control the second control node to have a logic state opposite to the logic state of the first control node in some periods,
    wherein the controller includes an inverter configured to supply said any one input clock to the second control node in some periods, except an output period which the output unit outputs said any one input clock, wherein the inverter comprises:
- a first inverter unit transistor configured to supply said any one input clock to a second connection node in response to said any one input clock;
- a second inverter unit transistor configured to connect the second connection node and the second predetermined voltage in response to the logic state of the first control node;
- a third inverter unit transistor configured to supply said any one input clock to the second control node in response to a logic state of the second connection node; and
- a fourth inverter unit transistor configured to connect the second control node and the second predetermined voltage in response to the logic state of the first control node.

5. The shift register according to claim 4, wherein the first inverter unit transistor and the second inverter unit transistor are connected in series between a terminal of said any one input clock and a supply terminal of the second predetermined voltage and
the third inverter unit transistor and the fourth inverter unit transistor are connected in series between the terminal of said any one input clock and the supply terminal of the second predetermined voltage.

6. The shift register according to claim 4, wherein the output unit includes a pull-up switching element configured to output said any one input clock as a scan output in response to the first control node and a pull-down switching element configured to output a first gate off voltage as the scan output in response to the second control node.

7. The shift register according to claim 4, wherein:
in a first period, the first control node is set to a first logic level of the previous output through the noise cleaner when the previous clock and the previous output are first logic levels,
in a second period, the output unit outputs the any one input clock as an output of a corresponding stage while the first control node is maintained at the first logic level,
in a third period, the first control node is reset to a second logic level of the previous output through the noise cleaner when the previous clock is the first logic level and the previous output is the second logic level, and
thereafter, while the first control node is maintained at the second logic level, the noise of the first control node by the any one input clock is eliminated through the noise cleaner in the overlap time of the pulses of the previous clock and the any one input clock whenever the any one input clock is the first logic level.

* * * * *